(12) United States Patent
Shimizu

(10) Patent No.: US 11,047,884 B2
(45) Date of Patent: Jun. 29, 2021

(54) CURRENT SENSOR

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/574,275

(22) Filed: Sep. 18, 2019

(65) Prior Publication Data
US 2020/0011902 A1    Jan. 9, 2020

Related U.S. Application Data

(63) Continuation of application No. PCT/JP2017/040716, filed on Nov. 13, 2017.

(30) Foreign Application Priority Data

Apr. 4, 2017  (JP) .............................. JP2017-074606

(51) Int. Cl.
*G01R 15/20*  (2006.01)
*G01R 19/00*  (2006.01)
*G01R 33/09*  (2006.01)

(52) U.S. Cl.
CPC ......... *G01R 15/205* (2013.01); *G01R 15/202* (2013.01); *G01R 19/0092* (2013.01); *G01R 33/09* (2013.01)

(58) Field of Classification Search
CPC .. G01R 15/205; G01R 15/202; G01R 15/207; G01R 33/091; G01R 33/0029; G01R 33/0094
See application file for complete search history.

(56) References Cited

U.S. PATENT DOCUMENTS 5,041,780 A * 8/1991 Rippel ................. G01R 15/207
324/117 H
6,459,255 B1 * 10/2002 Tamai ................. G01R 15/202
324/117 H
(Continued)

FOREIGN PATENT DOCUMENTS

JP    2001-339109 A    12/2001
JP    2002-523751 A    7/2002
(Continued)

OTHER PUBLICATIONS

Official Communication issued in International Patent Application No. PCT/JP2017/040716, dated Jan. 16, 2018.

*Primary Examiner* — Dominic E Hawkins
(74) *Attorney, Agent, or Firm* — Keating & Bennett, LLP

(57) ABSTRACT

A current sensor includes a conductor through which a current as a measurement target flows and two magnetic sensors. The conductor includes a first flow path, a second flow path adjacent to or in a vicinity of the first flow path in a width direction of the first flow path, and a first joining portion in which the first flow path and the second flow path merge with each other. The two magnetic sensors are provided side by side in a width direction and detect magnetic fields produced by currents that flow through the conductor. The conductor is provided with a first notch portion, in which a side edge in a farther side portion from the second flow path, of both of side edges of the first flow path in the width direction is notched.

22 Claims, 18 Drawing Sheets

(56) References Cited

U.S. PATENT DOCUMENTS

| | | | |
|---|---|---|---|
| 6,512,359 B1* | 1/2003 | Tamai | G01R 15/207 |
| | | | 324/117 H |
| 6,636,029 B1 | 10/2003 | Kunze et al. | |
| 9,733,280 B2* | 8/2017 | Hegedus | G01R 15/207 |
| 2010/0156394 A1* | 6/2010 | Ausserlechner | G01R 19/0092 |
| | | | 324/144 |
| 2011/0270553 A1* | 11/2011 | Ausserlechner | G01R 22/066 |
| | | | 702/64 |
| 2015/0204915 A1* | 7/2015 | Okuyama | G01R 19/0092 |
| | | | 324/117 R |
| 2016/0033557 A1* | 2/2016 | Hwangbo | G01R 15/207 |
| | | | 324/76.11 |
| 2017/0285076 A1* | 10/2017 | Okuyama | G01R 33/025 |
| 2018/0038898 A1 | 2/2018 | Shimizu | |

FOREIGN PATENT DOCUMENTS

| | | |
|---|---|---|
| JP | 2003-090850 A | 3/2003 |
| JP | 2007-078418 A | 3/2007 |
| JP | 2014-134458 A | 7/2014 |
| WO | 2017/010219 A1 | 1/2017 |

* cited by examiner

CURRENT SENSOR

CROSS REFERENCE TO RELATED APPLICATIONS

This application claims the benefit of priority to Japanese Patent Application No. 2017-074606 filed on Apr. 4, 2017 and is a Continuation Application of PCT Application No. PCT/JP2017/040716 filed on Nov. 13, 2017. The entire contents of each application are hereby incorporated herein by reference.

BACKGROUND OF THE INVENTION

1. Field of the Invention

The present invention relates to a current sensor that measures a current based on a magnetic field produced by the current.

2. Description of the Related Art

Japanese Unexamined Patent Application Publication No. 2007-78418 discloses a current sensor that detects the magnitude of a current which flows through a busbar including two parallel lines. The current sensor includes two hall elements, and the two hall elements are arranged to be interposed between the two lines in the thickness direction of the busbar and respectively detect the magnitudes of the magnetic fields caused in accordance with the currents that flow through the two lines. The current sensor differentially amplifies output voltages of the two hall elements. Accordingly, an influence of a disturbance magnetic field may be reduced.

SUMMARY OF THE INVENTION

Preferred embodiments of the present invention provide current sensors that each measure a current based on a magnetic field produced by the current and that may accurately measure a current.

A current sensor according to a preferred embodiment of the present invention includes a conductor through which a current as a measurement target flows and two magnetic sensors. The conductor includes a first flow path, a second flow path adjacent to or in a vicinity of the first flow path in a width direction of the first flow path, and a first joining portion in which the first flow path and the second flow path merge with each other. The two magnetic sensors are provided side by side in a width direction and detect magnetic fields produced by currents that flow through the conductor. The conductor is provided with a first notch portion, in which a side edge in a farther side portion from the second flow path, of both of side edges of the first flow path in the width direction is notched. A first magnetic sensor of the two magnetic sensors, which is located in a position closer to the first flow path than to the second flow path, is positioned in a vicinity of the side edge on an opposite side to the first notch portion in the first flow path.

Current sensors according to preferred embodiments of the present invention are each able to accurately measure a current when the current is measured based on a magnetic field produced by the current.

The above and other elements, features, steps, characteristics and advantages of the preferred embodiments of the present invention will become more apparent from the following detailed description of the preferred embodiments with reference to the attached drawings.

DETAILED DESCRIPTION OF THE PREFERRED EMBODIMENTS

Preferred embodiments of a current sensor according to the present invention will be described hereinafter with reference to the attached drawings.

Each preferred embodiment is an example and partial substitution or combination of configurations described in different preferred embodiments of the present invention is possible. In second and subsequent preferred embodiments of the present invention, elements and portions common to the first preferred embodiment of the present invention will not be described, and only different points will be described. Particularly, similar advantageous operations and effects by similar configurations will not be described for each preferred embodiment.

First Preferred Embodiment

1. Structure

Figure 1:
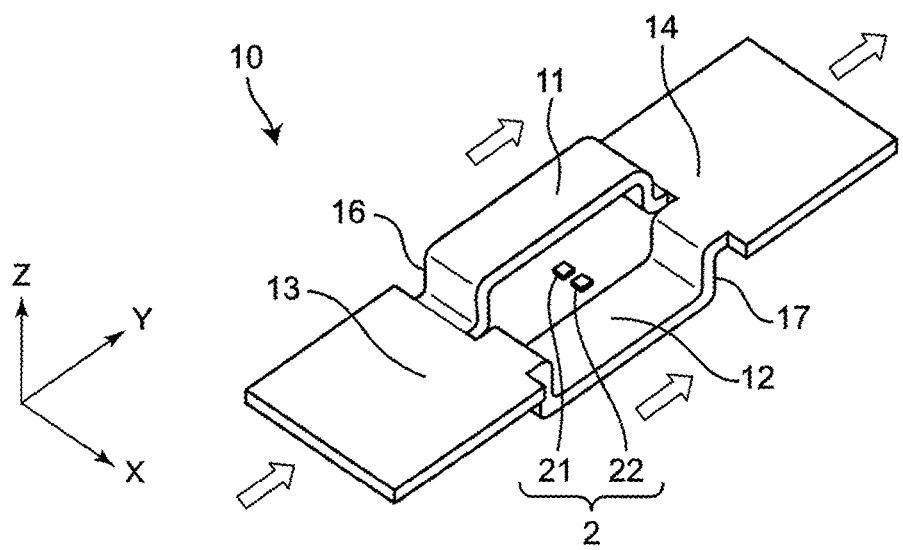
FIG. 1 is a perspective view of a current sensor according to a first preferred embodiment of the present invention.

A structure of a current sensor according to the first preferred embodiment of the present invention is described below with reference to FIGS. 1 to 4. FIG. 1 is a perspective view of a current sensor 1 according to the first preferred embodiment.

As shown in FIG. 1, the current sensor 1 according to the first preferred embodiment includes a busbar 10 and a magnetic detector 2. The magnetic detector 2 includes two magnetic sensors 21 and 22. Note that in FIG. 1, fixing members (such as a substrate and a housing) of the magnetic sensors 21 and 22 in the magnetic detector 2 are not shown (the same applies to the following).

The busbar 10 includes a plate-shaped conductor. In the following, the longitudinal direction of the busbar 10 is set as the Y direction, the width direction is set as the X direction, and the thickness direction is set as the Z direction.

The busbar 10 is branched into two flow paths 11 and 12 at one intermediate portion in the Y direction (longitudinal direction). In other words, the busbar 10 includes first and second flow paths 11 and 12 that extend in the Y direction, a first joining portion 13 in which the flow paths 11 and 12 merge with each other on the −Y side, and a second joining portion 14 in which the flow paths 11 and 12 merge with each other on the +Y side. Various dimensions of the first and second flow paths 11 and 12 are not particularly limited but are set to cross-sectional areas and dimensions that are the same or substantially the same as each other, for example.

FIG. 1 shows the direction of a current in a case where the current flows from the first joining portion 13 side into the busbar 10 in the current sensor 1. In this case, the current branches at the first joining portion 13 into the first flow path 11 and the second flow path 12. The respective branching currents flow in the +Y direction in the first flow path 11, flow in the +Y direction in the second flow path 12 also, and flow to the outside from the second joining portion 14.

The magnetic detector 2 detects magnetic fields caused by the currents that flow through the busbar 10 in the first and second magnetic sensors 21 and 22. Each of the magnetic sensors 21 and 22 has a sensitivity axis for sensing a magnetic field of a prescribed single-axis component. The directions of the sensitive axes of the magnetic sensors 21 and 22 are preferably parallel or substantially parallel with the X direction in an allowable error range, for example. The changes of increase and decrease of outputs with respect to the magnetic fields in the same or substantially the same direction preferably have the same or substantially the same tendency as each other. Details of the magnetic detector 2 will be described later.

Figure 2:
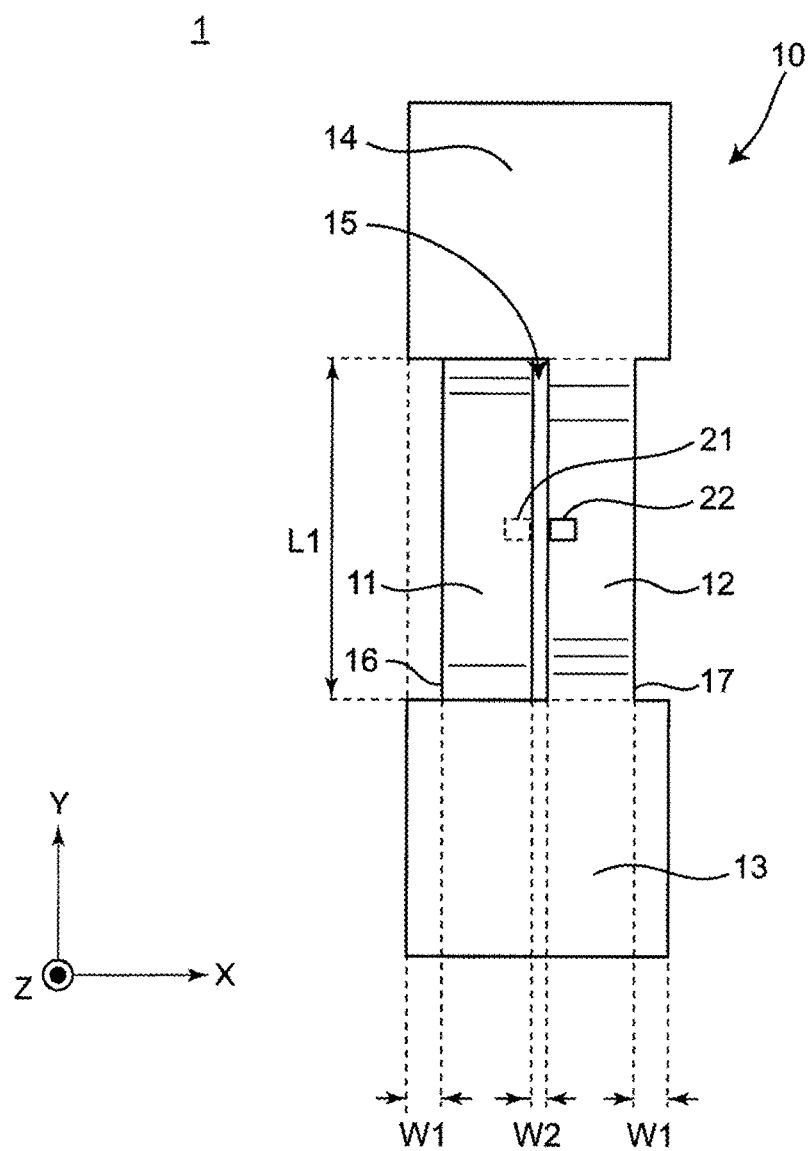
FIG. 2 is a plan view of the current sensor according to the first preferred embodiment of the present invention.

A plan view of the current sensor 1 from the Z direction of FIG. 1 is shown in FIG. 2. As shown in FIG. 2, the first flow path 11 and the second flow path 12 are juxtaposed to each other with the X direction being the respective width directions. Further, in the busbar 10, a slit 15 that extends along the Y direction is provided between the first flow path 11 and the second flow path 12.

The first magnetic sensor 21 and the second magnetic sensor 22 are arranged side by side with the slit 15 interposed therebetween in the X direction. The first magnetic sensor 21 is arranged in a position closer to the first flow path 11 than to the second magnetic sensor 22. The second magnetic sensor 22 is arranged in a position closer to the second flow path 12 than to the first magnetic sensor 21.

In the current sensor 1 according to the first preferred embodiment, as shown in FIGS. 1 and 2, the busbar 10 is provided with a first notch portion 16 in which an entire or substantially an entire side edge in an outer side portion (a farther side portion from the slit 15) of the first flow path 11 is notched. In addition, the busbar 10 is provided with a second notch portion 17 in which an entire or substantially an entire side edge in an outer side portion of the second flow path 12 is notched.

As shown in FIG. 2, the first notch portion 16 has a notch width W1 in the X direction and a notch length L1 in the Y direction. The notch width W1 is preferably wider than a width (slit width) W2 of the slit 15 in the X direction.

In the first preferred embodiment, the notch length L1 is preferably equal or substantially equal to the length of the first flow path 11 in the Y direction. Further, the notch width W1 is constant or substantially constant in the entire range of the side edge of the first flow path 11 in the Y direction. Further, the second notch portion 17 preferably has the same or substantially the same notch width W1 and notch length L1 as the first notch portion 16.

As shown in FIG. 2, the positions (Y positions) of the first and second magnetic sensors 21 and 22 in the Y direction are positioned in the vicinities of respective central positions of the flow paths 11 and 12, that is, at the centers or approximate centers. Further, in the X direction, the X position of the first magnetic sensor 21 is positioned closer to an inner side portion between the first notch portion 16 side (outer side portion) and the slit 15 side (inner side portion) of the first flow path 11. That is, the first magnetic sensor 21 is positioned in the vicinity of a side edge on the opposite side from the first notch portion in the first flow path 11. Similarly, the second magnetic sensor 22 is positioned closer to an inner side portion of the second flow path 12 than to the second notch portion 17.

In the above-described positional relationship of the magnetic sensors 21 and 22 to the notch portions 16 and 17, as described later, the signal to noise ratios of the magnetic sensors 21 and 22 are increased, and the current measurement precision by the current sensor 1 is able to be significantly increased.

Figure 3:
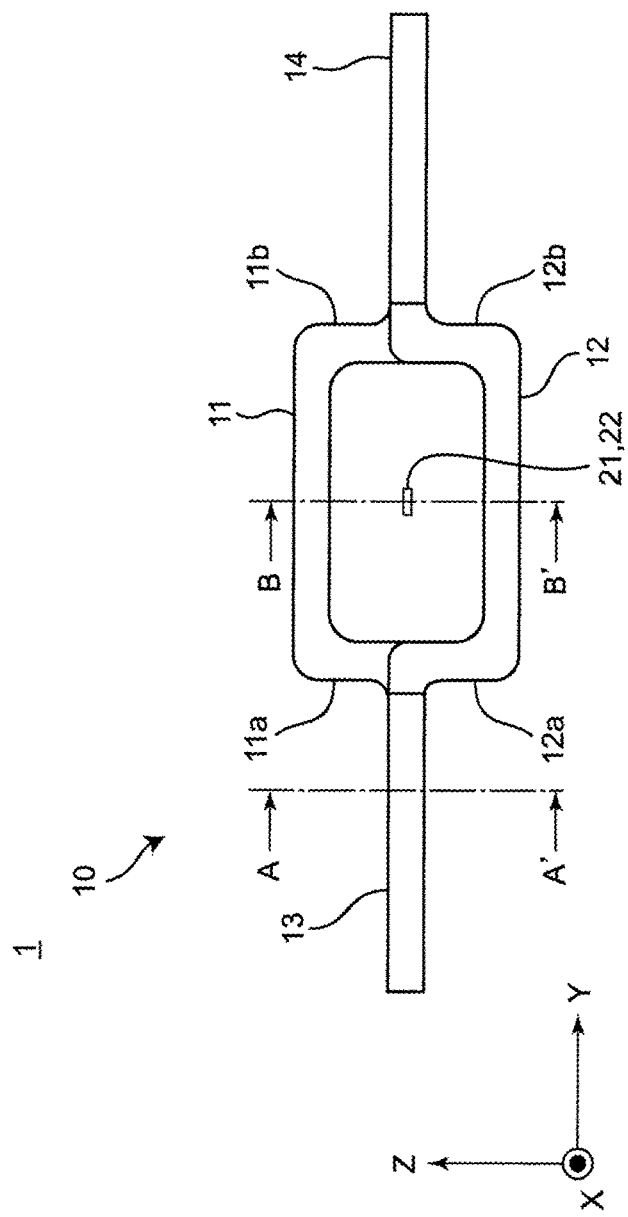
FIG. 3 is a side view of the current sensor according to the first preferred embodiment of the present invention.

A side view of the current sensor 1 as seen in the X direction of FIG. 2 is shown in FIG. 3. As shown in FIG. 3, in the busbar 10, the first flow path 11 is protruded to the +Z side, and the second flow path 12 is protruded to the −Z side (hereinafter, the Z direction may be referred to as "height direction").

As shown in FIG. 3, the first flow path 11 joins to the first joining portion 13 at an entrance 11a into which the current flows (in a case of above described FIG. 1) and joins to the second joining portion 14 at an exit 11b from which the current flows out. The entrance 11a and the exit 11b of the first flow path 11 are bent, and the Z position (position in the height direction) of the first flow path 11 is higher than the Z positions of the joining portions 13 and 14.

Further, the second flow path 12 joins to the first joining portion 13 at an entrance 12a and joins to the second joining portion 14 at an exit 12b. The entrance 12a and the exit 12b of the second flow path 12 are bent, and the Z position of the second flow path 12 is lower than the Z positions of the joining portions 13 and 14.

Consequently, the busbar 10 has a level difference due to the first flow path 11 (a portion of which extends in the Y direction) and the second flow path 12 (a portion of which extends in the Y direction) in different Z positions between the first and second joining portions 13 and 14. The Z positions of the magnetic sensors 21 and 22 are positioned in the range of the level difference (for example, the center) between the first and second flow paths 11 and 12.

Figure 4A:
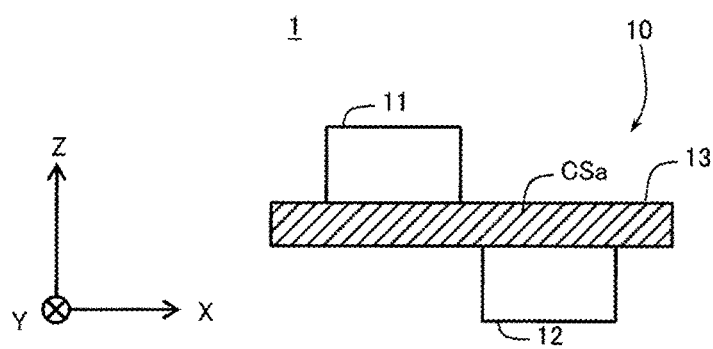
FIGS. 4A and 4B include sectional views of the current sensor according to the first preferred embodiment of the present invention.
Figure 4B:
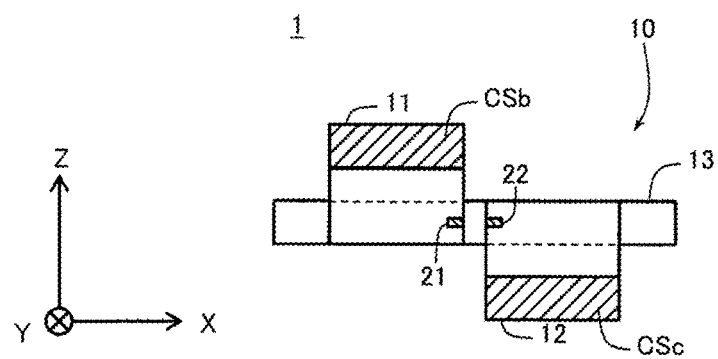

FIG. 4A shows the section of the current sensor 1 in A-A' section of FIG. 3. FIG. 4B shows the section of the current sensor 1 in B-B' section of FIG. 3. A-A' section is a section that is parallel with the XZ plane that passes through the first joining portion 13. B-B' section is a section that passes through the first and second flow paths 11 and 12 and is parallel with the XZ plane.

A cross-sectional area CSa shown in FIG. 4A is the maximum cross-sectional area of the first joining portion 13 among sections that are parallel with the XZ plane. A cross-sectional area CSb shown in FIG. 4B is the maximum cross-sectional area of the first flow path 11 among sections in the orientation common to the cross-sectional area CSa. A cross-sectional area CSc is the maximum cross-sectional area of the second flow path 12 among sections in the orientation common to the above.

In the busbar 10, as shown in FIGS. 4A and 4B, the maximum cross-sectional area CSa of the first joining portion 13 is larger than the sum of the maximum cross-sectional area CSb of the first flow path 11 and the maximum cross-sectional area CSc of the second flow path 12. Thus, a larger heat capacity is provided by the first joining portion 13 than the first and second flow paths 11 and 12. Further, the second joining portion 14 has the same or similar cross-sectional area to the first joining portion 13, and the same or approximately the same heat capacity as the first joining portion 13 may also be provided by the second joining portion 14. Accordingly, heat dissipation of the current sensor 1 may be significantly increased. Because the resistance value may be lowered by providing a large cross-sectional area in the busbar 10, the heat generation amount when current is applied to the busbar 10 is able to be reduced.

As a material of the busbar 10 in the above-described current sensor 1, a metal such as copper, silver, aluminum, or iron, an alloy that includes those metals, or the like, for example, may preferably be included. Further, surface finishing may be applied to the busbar 10. For example, at least one plating layer including a metal such as nickel, tin, silver, or copper or an alloy that includes those metals, for example, may preferably be provided on a surface of the busbar 10. Further, the busbar 10 may be formed by, for example, casting, machining, pressing, or the like.

Further, the busbar 10 may be provided by processing one conductor member or may be provided by combining a plurality of conductor members. For example, each of the joining portions 13 and 14 of the busbar 10 may be provided by screw fastening, welding, or the like. Further, in a processing of the busbar 10, a crack that becomes a starting point of a crevice or the like may be reduced or prevented by performing an R procedure or a C chamfering treatment, for example.

Further, in the above description, in the busbar 10, the respective entrances 11a and 12a and exits 11b and 12b of the flow paths 11 and 12 are bent, but may also be curved. Further, either the entrances 11a and 12a or the exits 11b and 12b may be bent (or curved). In this case, the Z positions of the two joining portions 13 and 14 may be different. Further, in the above description, in the busbar 10, both of the first and second flow paths 11 and 12 are protruded. However, the protrusions are not limited to the above description, for example, only one of the above protrusions may be protruded.

1-1. Magnetic Detector

Figure 5:
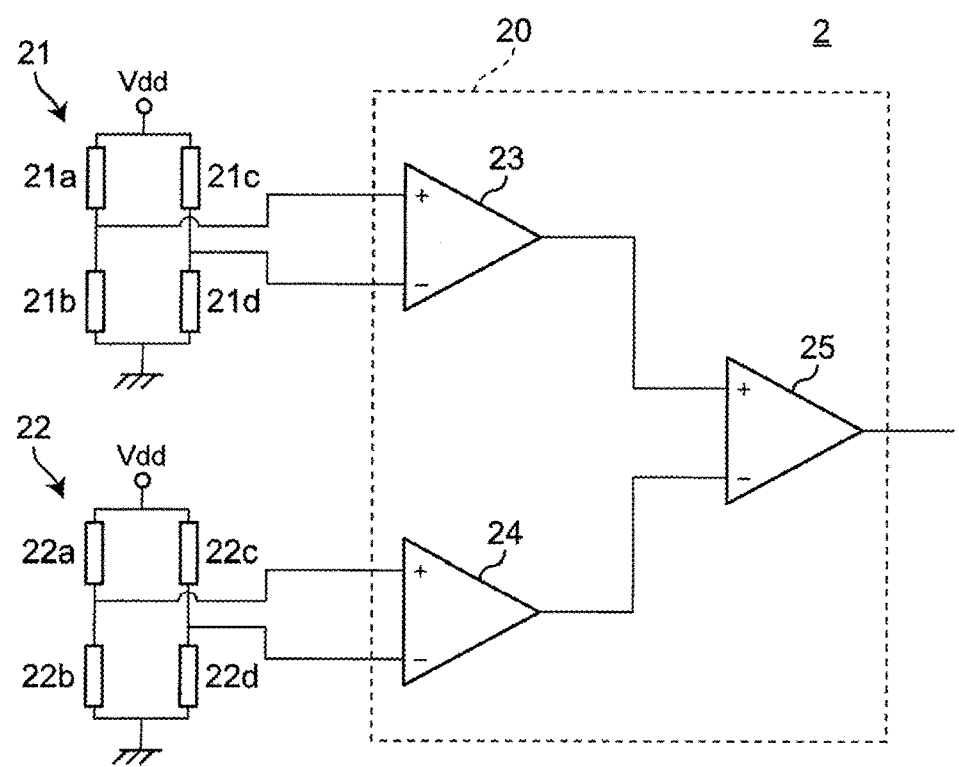
FIG. 5 is a circuit diagram of a magnetic detector in the current sensor.

Details of the magnetic detector 2 in the current sensor 1 are described below with respect to FIG. 5. FIG. 5 is a circuit diagram of the magnetic detector 2 in the current sensor 1. In the following, a description is provided of an example of circuitry in a case where the sensitivity axes of the first and second magnetic sensors 21 and 22 are directed in the same or substantially the same direction (for example, the +X direction).

The magnetic detector 2 exemplified in FIG. 5 includes an amplifier circuit 20 and the first and second magnetic sensors 21 and 22. The first and second magnetic sensors 21 and 22 are driven at a constant or substantially constant voltage of a power supply voltage Vdd, for example. The amplifier circuit 20 includes first to third operational amplifiers 23, 24, and 25. The above portions 21 to 25 may be integrated into one integrated chip or may be integrated into a plurality of integrated chips.

In this example, the first magnetic sensor 21 includes four magneto resistance elements 21a to 21d and defines a bridge circuit, which is preferably a Wheatstone bridge. That is, in the first magnetic sensor 21, a series circuit of two magneto resistance elements 21a and 21b and a series circuit of two remaining magneto resistance elements 21c and 21d are connected in parallel. Each of the magneto resistance elements 21a to 21d is preferably an anisotropic magneto resistance (AMR) element, for example.

A node between the two magneto resistance elements 21a and 21b in the first magnetic sensor 21 is connected to a non-inverting input terminal of the first operational amplifier 23. Further, a node between the two remaining magneto resistance elements 21c and 21d is connected to an inverting input terminal of the operational amplifier 23.

In this example, the second magnetic sensor 22 includes four magneto resistance elements 22a to 22d in similar circuitry to the magneto resistance elements 21a to 21d of the first magnetic sensor 21. A node between two magneto resistance elements 22a and 22b in the second magnetic sensor 22 is connected to a non-inverting input terminal of the second operational amplifier 24, and a node between two remaining magneto resistance elements 22c and 22d is connected to an inverting input terminal of the operational amplifier 24.

In the amplifier circuit 20, an output terminal of the first operational amplifier 23 is connected to a non-inverting input terminal of the third operational amplifier 25. An output terminal of the second operational amplifier 24 is connected to an inverting input terminal of the third operational amplifier 25.

In the above-described magnetic detector 2, in the amplifier circuit 20, the third operational amplifier 25 computes the subtraction between an output voltage of the first operational amplifier 23 and an output voltage of the second operational amplifier 24, and a detection result by the first and second magnetic sensors 21 and 22 is thereby differentially amplified.

The magnetic detector 2, which is described above, is an example and is not particularly limited to this. For example, the respective magneto resistance elements 21a to 21d and 22a to 22d of the magnetic sensors 21 and 22 are not limited to AMR elements but may be various MR elements provided on various kinds of substrates and may be a giant magneto resistance (GMR), a tunnel magneto resistance (TMR), a ballistic magneto resistance (BMR), a colossal magneto resistance (CMR), and so forth, for example.

Further, in each of the first and second magnetic sensors 21 and 22, a half bridge circuit may include two magneto resistance elements. Further, as the first and second magnetic sensors 21 and 22, a magnetic element that includes a hall element, a magnetic element that includes a magneto impedance (MI) element which uses a magneto impedance effect, a fluxgate magnetic element, or the like may be used. Further, as a driving method of the first and second magnetic sensors 21 and 22, constant current driving, pulse driving, or the like may be used.

Further, the first and second magnetic sensors 21 and 22 may be mounted on the same substrate or may be mounted on separate substrates. A material of the substrate(s) on which the first and second magnetic sensors 21 and 22 are mounted is not particularly limited, but may be a glass epoxy substrate or may be an alumina substrate, for example. Further, the positional relationship between the mounted magnetic sensors 21 and 22 and the substrate may be appropriately selected in consideration of the directions in which the sensitivity axes are directed, and so forth.

Further, each of the magnetic sensors 21 and 22 may be packaged or may be potted with silicon. A package shape of each of the magnetic sensors 21 and 22 is not particularly limited but may appropriately be selected from various kinds of shapes such as an HSOP, an SIP, and an LQFP in consideration of the directions of the sensitivity axes, the arrangement of the substrate, and the like. Further, the above package may include another circuit element, such as an ASIC, for example. Further, the magnetic detector 2, for example, may further include various circuits, such as correction circuits that correct gain or offsets of the magnetic sensors 21 and 22.

Further, in the above example, in the amplifier circuit 20, the third operational amplifier 25 computes the subtraction between the output voltages of the first and second operational amplifiers 23 and 24. However, a method of differential amplification is not limited to subtraction. For example, in a case where the respective sensitivity axes of the first and second magnetic sensors 21 and 22 are in the opposite directions to each other, detection results (of reverse phase magnetic fields) by the first and second magnetic sensors 21 and 22 may be differentially amplified by an amplifier circuit that computes the addition of both of the output voltages.

2. Operation

A description is provided in the following about the operation of the current sensor 1 described above.

2-1. Current Measurement

The current sensor 1 according to the first preferred embodiment detects the magnetic fields produced by the current that flows through the busbar 10 and thus measures the magnitude of the current. Current measurement by the current sensor 1 is described below with reference to FIG. 6.

Figure 6:
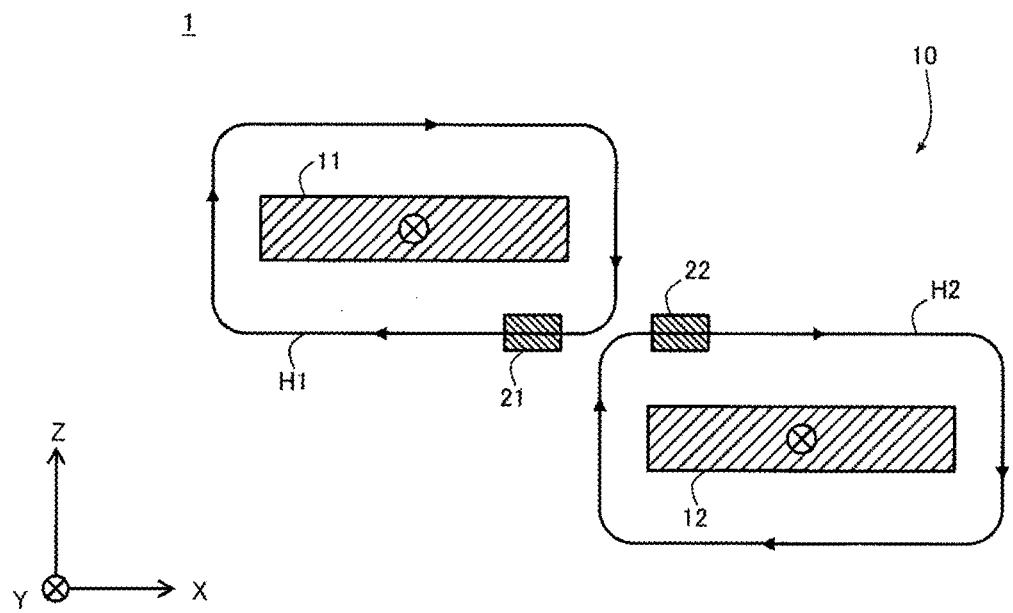
FIG. 6 is a diagram of signal magnetic fields in the current sensor according to the first preferred embodiment of the present invention.

FIG. 6 is a diagram of signal magnetic fields in the current sensor 1 according to the first preferred embodiment. A "signal magnetic field" represents a magnetic field produced by a current as a measurement target of the current sensor 1. FIG. 6 shows the flow paths 11 and 12 and the magnetic sensors 21 and 22 in the vicinity of B-B' section of FIG. 3 (see FIG. 4B).

FIG. 6 exemplifies a signal magnetic field H1 produced in the vicinity of the first flow path 11 and a signal magnetic field H2 produced in the vicinity of the second flow path 12 when a current flows in the +Y direction in the longitudinal direction (Y direction) of the busbar 10. In the busbar 10, the current branches and flows into the first flow path 11 and the second flow path 12, as shown in FIG. 6, the signal magnetic field H1 in the vicinity of the first flow path 11 thus circulates around the first flow path 11, and the signal magnetic field H2 in the vicinity of the second flow path 12 circulates around the second flow path 12.

In the current sensor 1 according to the first preferred embodiment, because the currents flow in the same or substantially the same direction (for example, the +Y direction) in the first flow path 11 and the second flow path 12, the signal magnetic field H1 in the vicinity of the first flow path 11 and the signal magnetic field H2 in the vicinity of the second flow path 12 have the same circulation direction (for example, clockwise). Consequently, in a region between the first and second flow paths 11 and 12, as shown in FIG. 6, the X component of the signal magnetic field H1 in the vicinity of the first flow path 11 and the X component of the signal magnetic field H2 in the vicinity of the second flow path 12 are in the opposite directions to each other. Therefore, the signal magnetic fields H1 and H2 in the reverse phases to each other are input to the first and second magnetic sensors 21 and 22 arranged in the above region.

The first magnetic sensor 21 generates the output voltage that corresponds to the input magnetic field as a detection result of the signal magnetic field H1 in the vicinity of the first flow path 11. The second magnetic sensor 22 generates the output voltage that corresponds to the input magnetic field as a detection result of the signal magnetic field H2 in the vicinity of the second flow path 12.

Here, it is assumed that the magnetic fields input to the magnetic sensors 21 and 22 include not only the signal magnetic fields H1 and H2 but also noises, such as disturbance magnetic fields. Such noises are considered to be input to the magnetic sensors 21 and 22 in the same or substantially the same phase and at approximately the same magnitude because the arrangement positions of the first and second magnetic sensors 21 and 22 are close to each other.

Thus, in the magnetic detector 2, the amplifier circuit (FIG. 5) differentially amplifies the output voltage that represents the detection result of the signal magnetic field H1 by the first magnetic sensor 21 and the output voltage that represents the detection result of the signal magnetic field H2 by the second magnetic sensor 22. Accordingly, the noises that may be included in the output voltages of the magnetic sensors 21 and 22 in the same or substantially the same phase are canceled, and the signal magnetic fields of the currents as the measurement targets may thus be accurately detected. Accordingly, in the current sensor 1, the magnitude of the current as the measurement target may be accurately measured.

2-2. Simulations

For the above-described current sensor 1, the inventor of preferred embodiments of the present invention performed two analysis simulations about the signal magnetic fields. First and second simulations in the first preferred embodiment are described below with respect to FIGS. 7 to 9.

Figure 7:
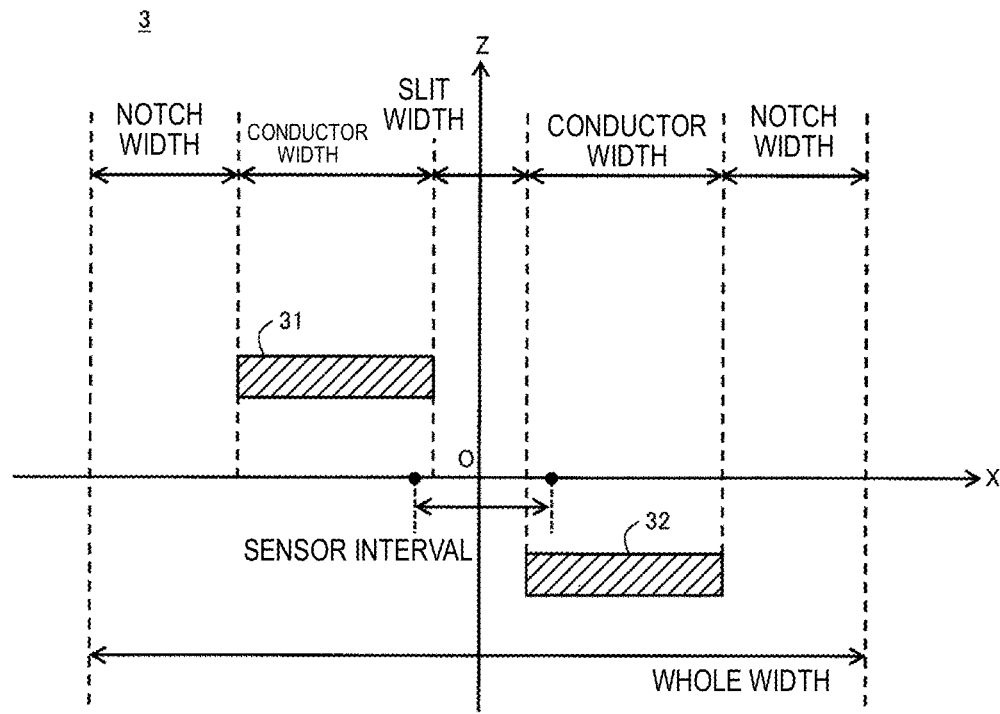
FIG. 7 is a diagram of a simulation model about the current sensor according to the first preferred embodiment of the present invention.

FIG. 7 is a diagram of an analysis model 3 about the current sensor 1 in the first preferred embodiment. In the first and second simulations in the first preferred embodiment, electromagnetic field analysis simulations in a case where a prescribed current was caused to flow through the busbar 10 of the current sensor 1 were performed by the finite element method.

The analysis model 3 is a simulation model that performs a magnetic field analysis in the vicinity of the magnetic sensors and 22 of the current sensor 1 and corresponds to one intermediate portion (the vicinity of each of the magnetic sensors 21 and 22) of each of the first and second flow paths 11 and 12 (see FIG. 6). The space size of the analysis model 3 in the Y direction (the depth direction of the page of FIG. 7) was set to about 3.0 mm.

As shown in FIG. 7, the analysis model 3 includes a first conductor 31 that corresponds to the first flow path 11 of the current sensor 1 (FIG. 6) and a second conductor 32 that corresponds to the second flow path 12. The thickness (Z direction) of each of the conductors 31 and 32 was set to about 1.5 mm. Further, meshes for the magnetic field analysis were appropriately set around the first and second conductors 31 and 32.

The interval between inner side portions of the conductors 31 and 32 in the analysis model 3 corresponds to the slit width W2 (FIG. 2) in the current sensor 1. Further, the interval between outer side portions of the conductors 31 and 32 corresponds to the interval between the first notch portion 16 and the second notch portion 17 in the current sensor 1.

In the first simulation that used the above-described analysis model 3, the magnetic field analysis was performed while the conductor widths (flow path widths) of the conductors 31 and 32 were maintained constant and the slit width was changed. In the first simulation, increasing the slit width corresponds to decreasing the notch widths, and decreasing the slit width corresponds to increasing the notch widths.

Figure 8:
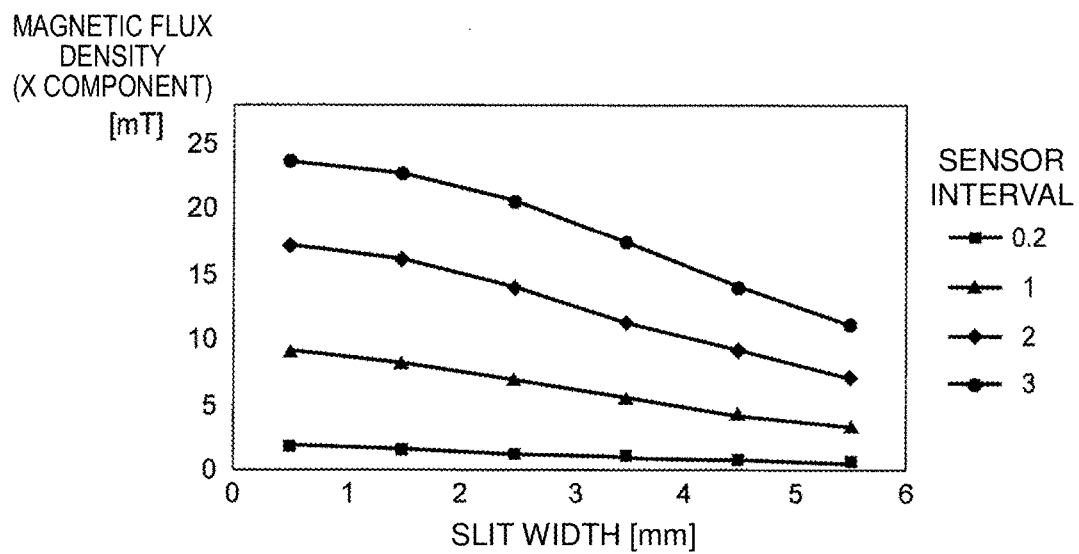
FIG. 8 is a graph that shows first simulation results about the current sensor according to the first preferred embodiment of the present invention.

Further, in the first simulation, numerical calculation was performed for the signal magnetic fields in a case where the magnetic sensors 21 and 22 were arranged at various sensor intervals in the vicinity of the inner side portions between the conductors 31 and 32. Note that the Y positions (the depth direction of the page of FIG. 7) of the magnetic sensors 21 and 22 were set to the center positions in the Y direction in the space of the analysis model 3. FIG. 8 represents results of the first simulation.

In the graph of FIG. 8, the horizontal axis represents the slit width [mm], and the vertical axis represents the intensity [mT] of the X component of the magnetic flux density. The plot on the graph of FIG. 8 represents the differential values of the X component intensity of the magnetic flux density in the positions in which the respective sensor intervals are provided and corresponds to the signal magnetic fields input to the first and second magnetic sensors 21 and 22 at the respective sensor intervals.

In the first simulation, as shown in FIG. 8, the X component intensity of the magnetic flux density becomes lower as the sensor interval becomes shorter. Meanwhile, the X component intensity of the magnetic flux density becomes higher as the slit width becomes narrower. From such simulation results, the inventor of preferred embodiments of the present invention inferred that the distance between the conductors 31 and 32 (between the flow paths 11 and 12) was shortened by narrowing the slit width and the slope of the magnetic field distribution was thus made steeper.

Figure 9:
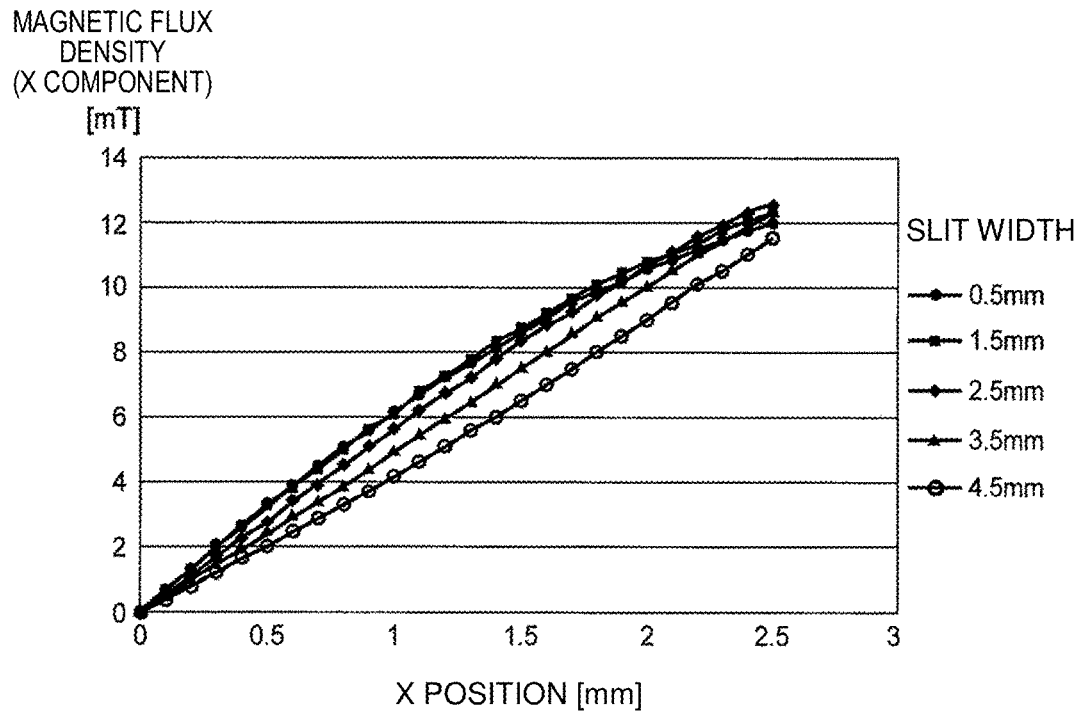
FIG. 9 is a graph that shows second simulation results about the current sensor according to the first preferred embodiment of the present invention.

In the second simulation, the magnetic field analysis was performed while the interval between the outer side portions of the conductors 31 and 32 of the analysis model 3 was maintained constant and the slit width was changed. In the second simulation, increasing the slit width corresponds to decreasing the conductor widths (flow path widths), and decreasing the slit width corresponds to increasing the conductor widths. Further, in the second simulation, when various slit width were set, numerical calculation was performed for the magnetic field distribution in the X position in the vicinity of the slit. FIG. 9 represents results of the second simulation.

In the graph of FIG. 9, the horizontal axis represents the X position [mm], and the vertical axis represents the X component intensity [mT] of the magnetic flux density. The X position=0 in FIG. 9 is the central position between the conductors 31 and 32. The range of X position (0 mm or greater to about 3 mm or smaller) indicated in FIG. 9 is positioned in the vicinity of the slit on the second conductor 32 side.

In the second simulation, as shown in FIG. 9, it was observed that although the conductor widths became wider in the vicinity of the slit between the conductors 31 and 32 as the slit interval became shorter, the X component intensity of the magnetic flux density became higher. Note that in the second simulation, also in the vicinity of the slit on the first conductor 31 side, similar results to FIG. 9 were obtained (however, the sign, positive or negative, of the X component of the magnetic flux density was reversed).

From the above-described results of the first and second simulations, it is understood that when the sensor interval in the current sensor 1 is shortened for noise cancellation, the signal magnetic fields input to the magnetic sensors 21 and 22 become smaller as shown in FIG. 8. Further, in a qualitative view, the conductor widths may be narrowed to provide larger signal magnetic fields. However, as shown in FIG. 9, it was observed that if the conductor widths were simply narrowed (the slit width was widened), the signal magnetic fields became smaller in sensor positions in the vicinity of the slit.

Based on the above-described findings, in the current sensor 1 according to the first preferred embodiment, the notch widths W1 of the notch portions 16 and 17 in the outer side portions of the flow paths 11 and 12, which correspond to the conductors 31 and 32, are wider than the slit width W2, and the slit width W2 is narrowed (see FIG. 2).

In the above structure, as shown in FIG. 8, even in a case where the sensor interval is set to a narrow range such as the vicinity of the slit, the notch widths W1 are widened, the slit width W2 is narrowed, and the signal magnetic fields input to the magnetic sensors 21 and 22 may thus be largely secured. Further, as shown in FIG. 8, the slit width is narrowed, the signal magnetic fields thus become larger in the sensor positions in the vicinity of the slit, in which noises in the same or substantially the same phases may be canceled, the signal to noise ratio in the current sensor 1 is increased, and the current measurement precision is significantly increased.

3. Conclusion

As described above, the current sensor 1 according to the first preferred embodiment includes the busbar 10 as a conductor through which a current as a measurement target flows and the two magnetic sensors 21 and 22 that are arranged side by side in the X direction. The busbar 10 includes the first flow path 11, the second flow path 12 adjacent to or in a vicinity of the first flow path 11 in the width direction (X direction) of the first flow path 11, and the first joining portion 13 in which the first flow path 11 and the second flow path 12 merge with each other. The magnetic sensors 21 and 22 detect the magnetic fields produced by the currents that flow through the busbar 10. The busbar 10 is provided with the first notch portion 16, in which the side edge in the farther side (outer side) portion from the second flow path 12, of both of the side edges of the first flow path 11 in the X direction is notched. The first magnetic sensor 21 of the two magnetic sensors 21 and 22, which is arranged in the position closer to the first flow path 11 than to the second flow path 12, is positioned in the vicinity of the side edge on the opposite side (inner side) from the first notch portion 16 in the first flow path 11.

In the above current sensor 1, the first notch portion 16 narrows the width of the first flow path 11 and enlarges the signal magnetic field, and the signal magnetic field may thus be detected from an inner side portion in which noises may easily be reduced in the first magnetic sensor 21. Accordingly, in the current sensor 1, the signal to noise ratio is increased, and the current may thus be accurately measured.

In the first preferred embodiment, the notch width W1 of the first notch portion 16 in the X direction of the first flow path 11 is wider than an interval W2 between the first and second flow paths 11 and 12 in the X direction. Accordingly, the interval W2 between the first and second flow paths 11 and 12 is relatively narrowed with respect to the notch width W1, the slope of the signal magnetic field is thus steeper, the signal to noise ratio in the current sensor 1 is increased, and the measurement precision is significantly increased.

Further, in the first preferred embodiment, the busbar 10 is provided with the slit 15 that extends along the longitudinal direction (Y direction) of the busbar 10 between the first flow path 11 and the second flow path 12. The slit width W2 of the slit 15 is narrower than the notch width W1 of the first notch portion 16. Accordingly, the slit width W2 is narrower than the notch width W1, and the signal to noise ratio in the current sensor 1 is thus significantly increased.

Further, in the first preferred embodiment, the busbar 10 is provided with the second notch portion 17, in which the side edge in the farther side portion from the first flow path 11, of both of the side edges of the second flow path 12 in the X direction is notched. The second magnetic sensor 22 of the two magnetic sensors 21 and 22, which is arranged in the position closer to the second flow path 12 than to the first flow path 11, is positioned in the vicinity of the side edge on the opposite side to the second notch portion 17 in the second flow path 12. Accordingly, the detection precision of the signal magnetic field is also significantly increased in the second magnetic sensor 22, and the measurement precision of the current sensor 1 is thus significantly increased.

Further, in the first preferred embodiment, the first notch portion 16 and the second notch portion 17 are arranged side by side in the X direction. Accordingly, the slope of the signal magnetic field is steeper in a region in which the first and second notch portions 16 and 17 neighbor each other, and the detection precision of the signal magnetic field is thus significantly increased.

Further, in the first preferred embodiment, the slit width W2 of the slit 15 is narrower than the notch width W1 of each of the first and second notch portions 16 and 17. Accordingly, the slit width W2 is narrower than the notch width W1 of each of the first and second notch portions 16 and 17, and the signal to noise ratio in the current sensor 1 is thus significantly increased.

Further, in the first preferred embodiment, the first magnetic sensor 21 is arranged in a lateral side portion of the first notch portion 16 in the first flow path 11 and on one side (−Z side) of both sides (±Z sides) of the first flow path 11 in the Z direction that intersects the X and Y directions. The second magnetic sensor 22 is arranged in a lateral side portion of the second notch portion 17 in the second flow path 12 and on the −Z side of the first flow path 11 (the +Z side of the second flow path 12) in the Z direction. In such an arrangement, the X components of the signal magnetic fields input to the magnetic sensors 21 and 22 are provided in the reverse phases to each other (FIG. 6).

Note that in the current sensor 1, the second notch portion 17 does not necessarily have to be provided. For example, the gain of the first and second operational amplifiers 23 and 24 or the like in the amplifier circuit 20 of the magnetic detector 2 is adjusted in response to the difference in the width between the flow paths 11 and 12, and the detection precision by each of the magnetic sensors 21 and 22 is thus secured. Alternatively, the busbar 10 may be provided with the X position of the slit 15 moved so that the widths of the first and second flow paths 11 and 12 become the same or substantially the same. Even in the above-described case, the magnetic field slope between the flow paths 11 and 12 is steeper by providing the first notch portion 16, and the measurement precision of the current sensor 1 is thus significantly increased.

Further, in the first preferred embodiment, in the sections that have the common orientation along the X direction (parallel with the XY plane), the maximum cross-sectional area CSa of the first joining portion 13 is larger than the sum of the maximum cross-sectional area CSb of the first flow path 11 and the maximum cross-sectional area CSc of the second flow path 12. Accordingly, a larger heat capacity is provided in the first joining portion 13 than in the flow paths 11 and 12, and the heat dissipation of the current sensor 1 is significantly increased.

Further, in the first preferred embodiment, the first joining portion 13 joins the entrance 11a of the first flow path 11 and the entrance 12a of the second flow path 12 to each other. The busbar 10 includes the second joining portion 14 that joins the exit 11b of the first flow path 11 and the exit 12b of the second flow path 12 to each other. The second joining portion 14 provided to the busbar 10 may further significantly increase the heat dissipation of the current sensor 1. The resistance value is lowered by securing a large cross-sectional area in the second joining portion 14, and the heat generation amount when current is applied to the busbar 10 is thus reduced.

Further, in the first preferred embodiment, the first flow path 11 and the second flow path 12 are arranged in mutually different Z positions in the Z direction (height direction), which intersects the X and Y directions, between the first and second joining portions 13 and 14. The level difference between the first and second flow paths 12 is provided in the busbar 10.

Further, in the first preferred embodiment, the first magnetic sensor 21 and the second magnetic sensor 22 may include MR elements that are provided on a substrate common to each other. Such a substrate is arranged between the first flow path 11 and the second flow path 12 in the Z direction. Accordingly, the size of the current sensor 1 may be reduced.

Further, in the first preferred embodiment, the first magnetic sensor 21 and the second magnetic sensor 22 generate, as their detection results, outputs whose changes of increase and decrease with respect to the magnetic fields in the same or substantially the same direction have the same or substantially the same tendency as each other. The current sensor 1 further includes the amplifier circuit 20 that differentially amplifies the detection result of the first magnetic sensor 21 and the detection result of the second magnetic sensor 22. The differential amplification between the detection results of the magnetic sensors 21 and 22 may increase the signal to noise ratio in the current sensor 1.

Modification Example of the First Preferred Embodiment

In the above description, a description is provided of examples of the notch portions 16 and 17 in which the side edges of the flow paths 11 and 12 are notched at fixed widths in the busbar 10. However, the notch portion is not limited to this. A modification example of the notch portion in the first preferred embodiment is described below with respect to FIG. 10.

Figure 10:
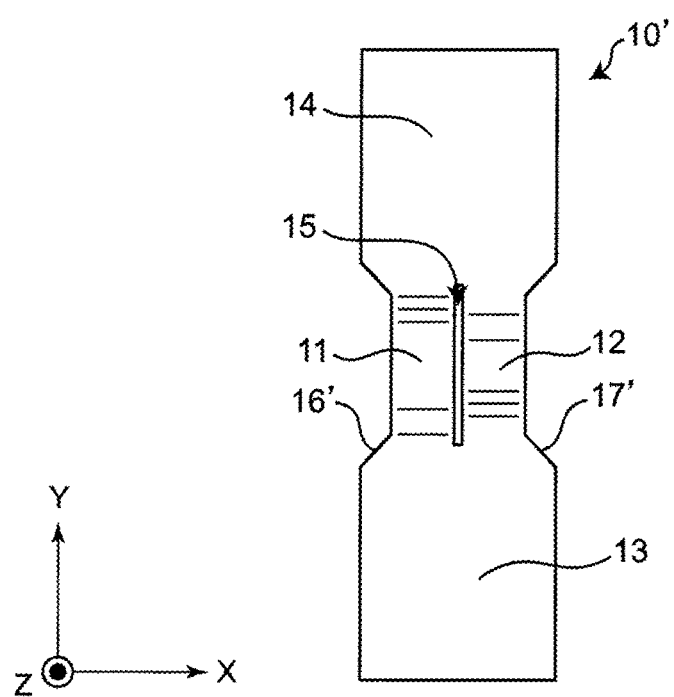
FIG. 10 is a plan view of a modification example of the current sensor according to the first preferred embodiment of the present invention.

FIG. 10 is a plan view of a modification example of the current sensor 1 according to the first preferred embodiment. FIG. 10 shows a busbar 10' in the present modification example.

In the present modification example, as shown in FIG. 10, first and second notch portions 16' and 17' are provided in shapes that continuously expand from the first joining portion 13 to the flow paths 11 and 12 in the busbar 10'. Further, the notch portions 16' and 17' are similarly provided in shapes that continuously expand on the second joining portion 14 side. Accordingly, the side edges of the flow paths 11 and 12 may be notched in various shapes that include the notch portions 16' and 17' in the busbar 10'.

Second Preferred Embodiment

In the first preferred embodiment, the notch portion is provided in the entire or substantially the entire side edge of the flow path. In a second preferred embodiment of the present invention, a notch portion is partially provided in a side edge of a flow path. Accordingly, the thermal load (heat generation when current is applied) in a current sensor may be reduced. In the following, a current sensor according to the second preferred embodiment is described below.

1. Structure

Figure 11:
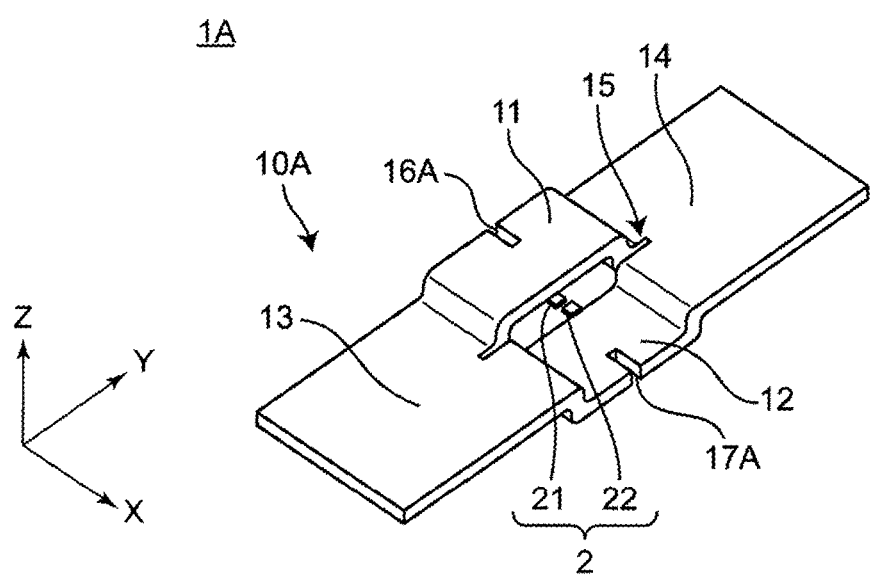
FIG. 11 is a perspective view of a current sensor according to a second preferred embodiment of the present invention.
Figure 12:
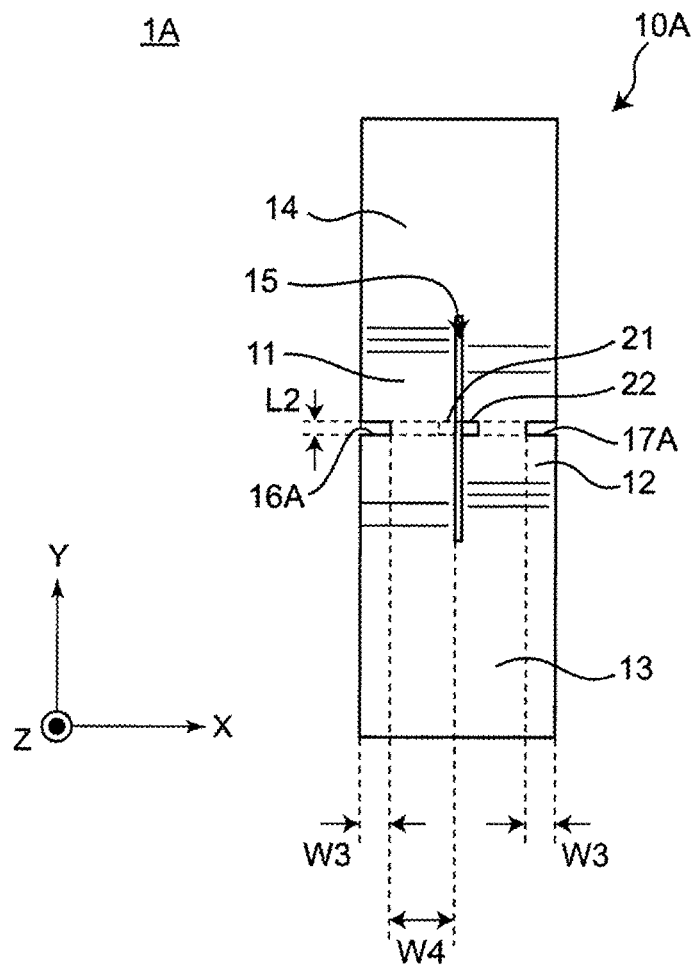
FIG. 12 is a plan view of the current sensor according to the second preferred embodiment of the present invention.

A structure of the current sensor according to the second preferred embodiment is described with reference to FIGS. 11 and 12. FIG. 11 is a perspective view of a current sensor 1A according to the second preferred embodiment. FIG. 12 is a plan view of the current sensor 1A in plan view from the Z direction of FIG. 11.

Similar to the first preferred embodiment, the current sensor 1A according to the second preferred embodiment includes first and second notch portions 16A and 17A, which are locally provided in portions of the side edges as shown in FIG. 11, instead of the notch portions 16 and 17 (FIG. 1) that are provided through the entire or substantially the entire side edges of the flow paths 11 and 12. In the second preferred embodiment, the notch portions 16A and 17A of a busbar 10A have rectangular or substantially rectangular shapes (FIG. 12).

As shown in FIG. 11, in the busbar 10A in the second preferred embodiment, the first notch portion 16A is provided in a portion of the range in the longitudinal direction (Y direction) in an outer side edge of the first flow path 11. As shown in FIG. 12, the Y position of the first notch portion 16A is positioned at the center or approximate of the first flow path 11 in the Y direction. A notch length L2 of the first notch portion 16A is a notch width W3 or shorter. Further, the notch width W3 of the first notch portion 16A is narrower than a flow path width W4 of a lateral side portion of a first notch portion 16A in the first flow path 11.

Further, the second notch portion 17A is provided in a portion of the range in the Y direction in an outer side edge of the second flow path 12 with similar dimensions and in a similar positional relationship to the above-described first notch portion 16A. The first notch portion 16A and the second notch portion 17A are arranged side by side in the X direction on the busbar 10A with the slit 15 located therebetween. Each of the notch widths W3 is wider than the slit width.

The first magnetic sensor 21 is positioned in the range (for example, at the center or approximate center) of the notch length L2 of the first notch portion 16A in the Y direction. Similarly, the second magnetic sensor 22 is positioned in the range of the notch length L2 of the second notch portion 17A in the Y direction. Note that at least a portion of the first magnetic sensor 21 and at least a portion of the second magnetic sensor 22 may be superimposed in the range of the notch length L2.

2. Heat Generation Evaluation Simulation

For the current sensor 1A described above, the inventor of preferred embodiments of the present invention performed a simulation for heat generation evaluation when current is applied to the busbar 10A.

Specifically, notch lengths of various values were set for a simulation model of the busbar 10A, and a thermal analysis simulation was performed which analyzed the heat generation state in a case where a prescribed current was caused to flow. This simulation was performed under conditions of a current value of about 129 A, an environmental temperature of about 105° C., a conductor thickness of about 1.5 mm, a slit width of about 0.5 mm, a flow path width (in the vicinity of the magnetic sensor) of about 5.0 mm, and a whole width (of the busbar) of about 15.5 mm.

Figure 13:
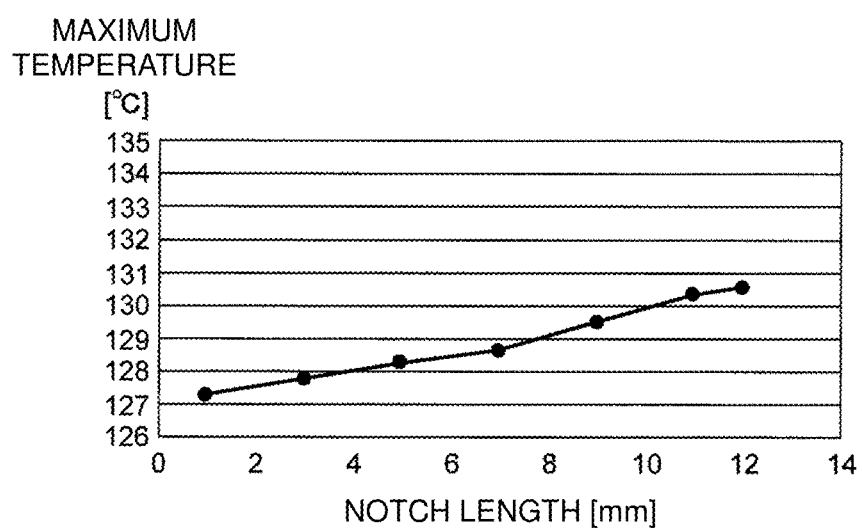
FIG. 13 is a graph that shows simulation results about the current sensor according to the second preferred embodiment of the present invention.

FIG. 13 is a graph that shows simulation results of the heat generation evaluation of the current sensor 1A. In the graph of FIG. 13, the horizontal axis represents the notch length [mm], and the vertical axis represents the maximum temperature [° C.] of a conductor.

From the graph in FIG. 13, it is understood that the maximum temperature in the busbar to which current is being applied becomes higher as the notch length is increased. This may be considered because the ratio of the portions whose cross-sectional areas become small increases in the busbar and the resistance values of the conductors become higher. In the current sensor 1A in the second preferred embodiment, the notch portions 16A and 17A with the short notch length L2 are included (see FIG. 12), the maximum temperature in the busbar 10A to which current is being applied is thus reduced, and the thermal load in the current sensor 1A is reduced.

Figure 14:
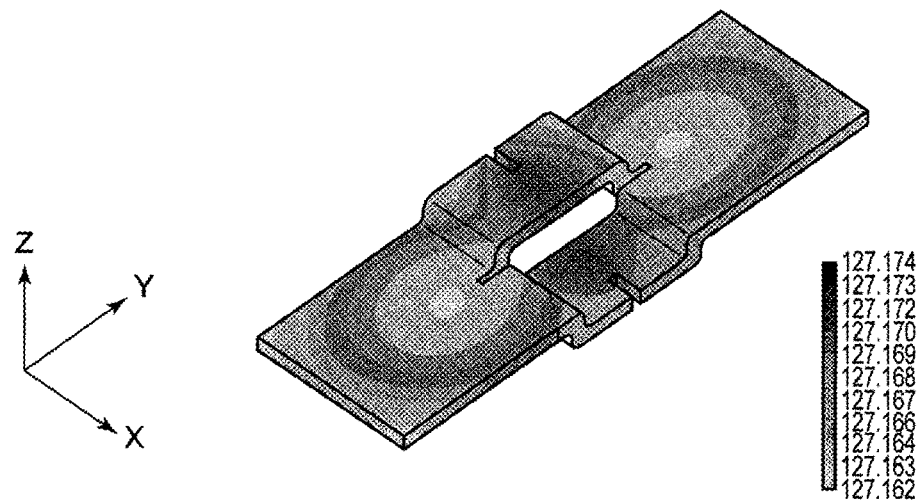
FIG. 14 is a diagram that shows an example of a simulation about the current sensor according to the second preferred embodiment of the present invention.
Figure 15:
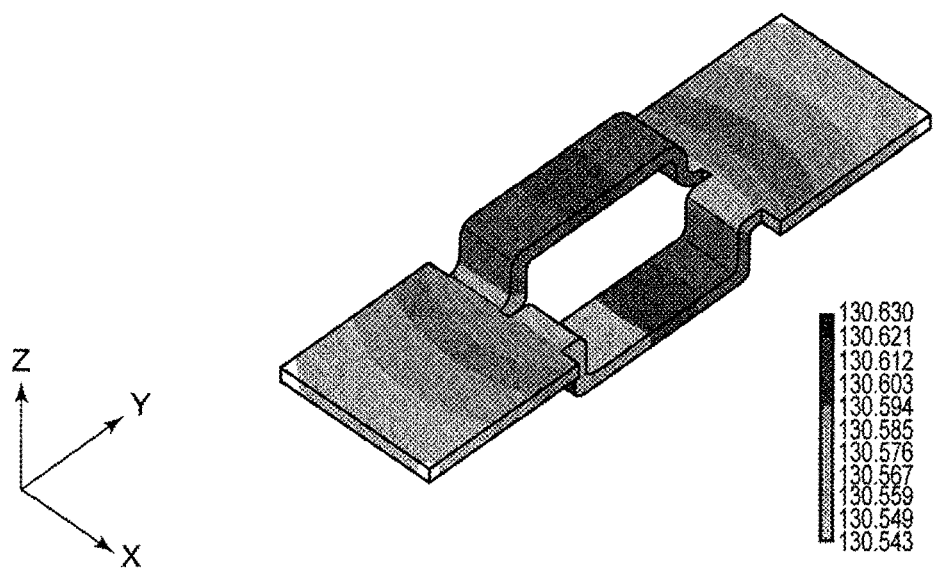
FIG. 15 is a diagram that shows another example of the simulation about the current sensor according to the second preferred embodiment of the present invention.

FIG. 14 shows the heat distribution in the busbar in which a notch length of about 1.0 mm is set in the above simulation. FIG. 15 shows the heat distribution in the busbar in which a notch length of about 12.0 mm is set. The setting in FIG. 14 corresponds to the current sensor 1A of the second preferred embodiment (FIG. 11), and the setting of FIG. 15 corresponds to the current sensor 1 of the first preferred embodiment (FIG. 1).

In FIGS. 14 and 15, lateral side portions, in which the notch portions in the flow paths are provided, of the busbar are regions at higher temperatures than the other regions. In a case where the notch length is long as shown in FIG. 15, the above-described high temperature regions reach about 130° C. On the other hand, if the notch length is shortened, even the high temperature regions are kept to temperatures of about 127° C. as shown in FIG. 14.

As described above, the current sensor 1A according to the second preferred embodiment may reduce heat generation when current is applied to the busbar 10A. Accordingly, in the current sensor 1A, the thermal load may be reduced, and the current measurement precision may be significantly increased.

3. Conclusion

As described above, in the current sensor 1A according to the second preferred embodiment, the first notch portion 16A is provided in a portion of the range in the longitudinal direction (Y direction) of the first flow path 11. At least a portion of the first magnetic sensor 21 is positioned in the range, in which the first notch portion 21 is provided, of the first flow path 11 in the Y direction. Accordingly, the region in the first flow path 11 in which the flow path width W4 is narrowed is restricted, heat generation when current is applied is reduced, and the current measurement precision is thus significantly increased.

In the second preferred embodiment, the first notch portion 16A is positioned at the center or approximate center of the first flow path 11 in the longitudinal direction. Accordingly, unevenness may be reduced or prevented when the heat generated in the vicinity of the first notch portion 16A is dissipated to the surroundings.

Further, in the second preferred embodiment, the Y position of the first magnetic sensor 21 in the longitudinal direction of the first flow path 11 is the center or approximate center of the first notch portion 16A. Such arrangement may reduce or prevent a circumstance in which the first magnetic sensor 21 sticks out from the first notch portion 16A due to misalignment and the current measurement precision lowers.

Further, in the second preferred embodiment, the notch width W3 of the first notch portion 16A is equal to or wider than the notch length L2 of the first notch portion 16A. Accordingly, the notch length L1 is restricted to the notch width W3 or shorter, and heat generation when current is applied is reduced.

Further, in the second preferred embodiment, in the X direction, the flow path width W4 of the first flow path 11 in the lateral side portion of the first notch portion 16A is wider than the notch width W3 of the first notch portion 16A. Accordingly, rigidity in the portion narrowed by the first notch portion 16A in the busbar 10 is ensured.

Further, in the second preferred embodiment, the second notch portion 17A is provided in a portion of the range in the longitudinal direction of the second flow path 12. Accordingly, the region in which the flow path width W4 is narrowed is also restricted in the second flow path 12, and heat generation when current is applied is reduced.

Modification Examples of the Second Preferred Embodiment

In the above description, an example is described where the notch portions 16A and 17A have rectangular or substantially rectangular shapes. However, the notch portion is not limited to a rectangular or substantially rectangular shape, and notch portions in various shapes may partially be provided in the side edge of the flow path. Such modification examples are described below with respect to FIGS. 16 and 17.

Figure 16:
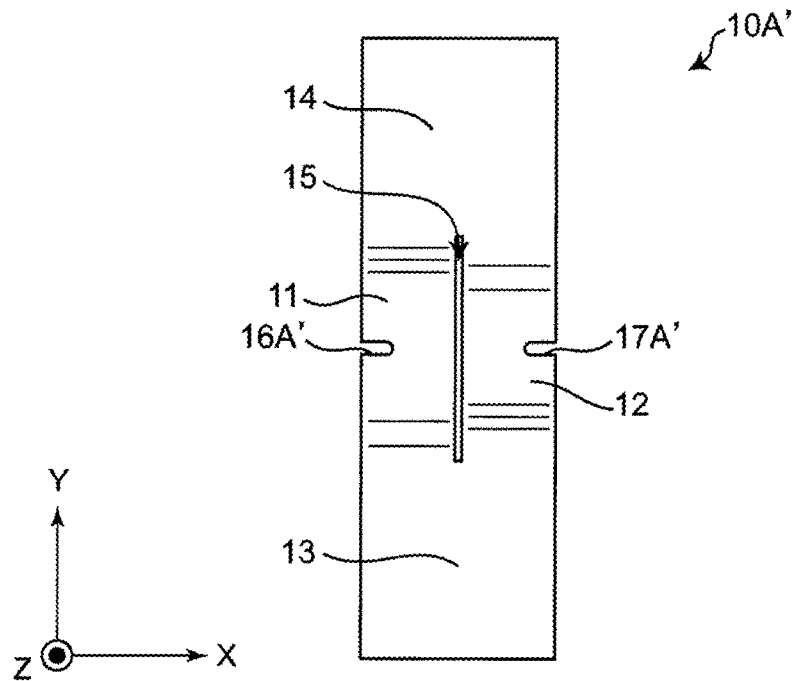
FIG. 16 is a plan view of modification example 1 of the current sensor according to the second preferred embodiment of the present invention.
Figure 17:
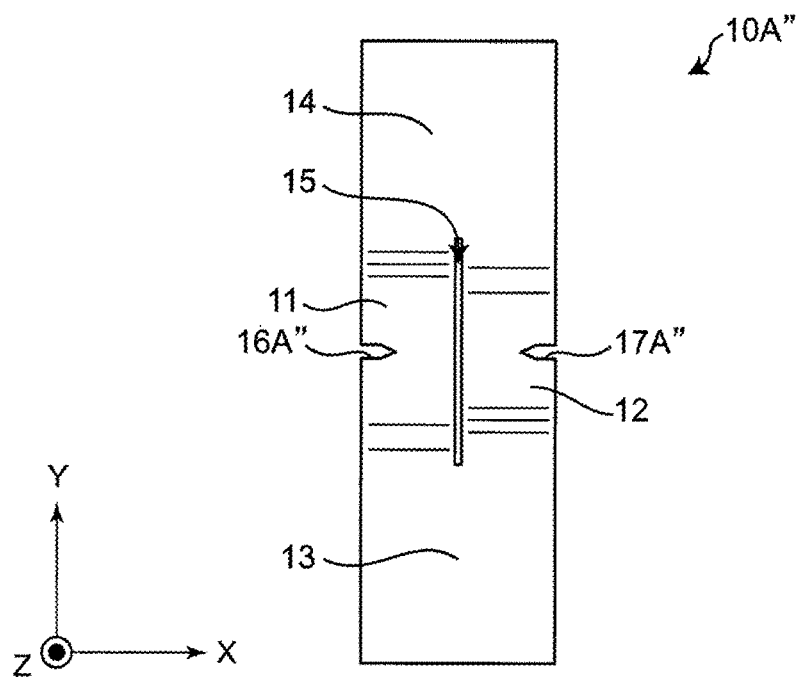
FIG. 17 is a plan view of modification example 2 of the current sensor according to the second preferred embodiment of the present invention.

FIG. 16 is a plan view that shows a modification example of the current sensor 1A according to the second preferred embodiment. FIG. 17 is a plan view that shows a modification example 2 of the current sensor 1A according to the second preferred embodiment. FIGS. 16 and 17 illustrate busbars 10A' and 10A" in the respective modification examples.

As shown in FIG. 16, first and second notch portions 16A' and 17A' may have shapes with rounded corners. For example, in response to the shapes of such notch portions 16A' and 17A', deformation resistance of the busbar 10A' in thermal expansion or the like is able to be significantly increased.

Further, as shown in FIG. 17, first and second notch portions 16A" and 17A" may have sharp shapes. As the shapes of the first and second notch portions 16A" and 17A", various shapes, such as shapes that facilitate a processing of a busbar 10A", may be provided.

Also in the current sensor 1A that includes the above-described busbar 10A' or 10A", at least a portion of the first magnetic sensor 21 (FIG. 12) is arranged to be superimposed on the range, in which the first notch portion 16A' or 16A" is provided, of the first flow path 11 in the Y direction. The notch width of the first notch portion 16A' or 16A" may be measured as the width, in the X direction, of the first notch portion 16A' or 16A" in the section of the busbar 10A' or 10A" along an XZ plane that passes through the first magnetic sensor 21 superimposed on the above range, for example. Similarly, the notch width of the second notch portion 17A' or 17A" may be measured as the width in the range, on which at least a portion of the second magnetic sensor 22 is superimposed, of the second flow path 12 in the Y direction.

Third Preferred Embodiment

In the third preferred embodiment of the present invention, a description is provided of a current sensor in which magnets for magnetic bias are further provided in a magnetic detector.

Figure 18:
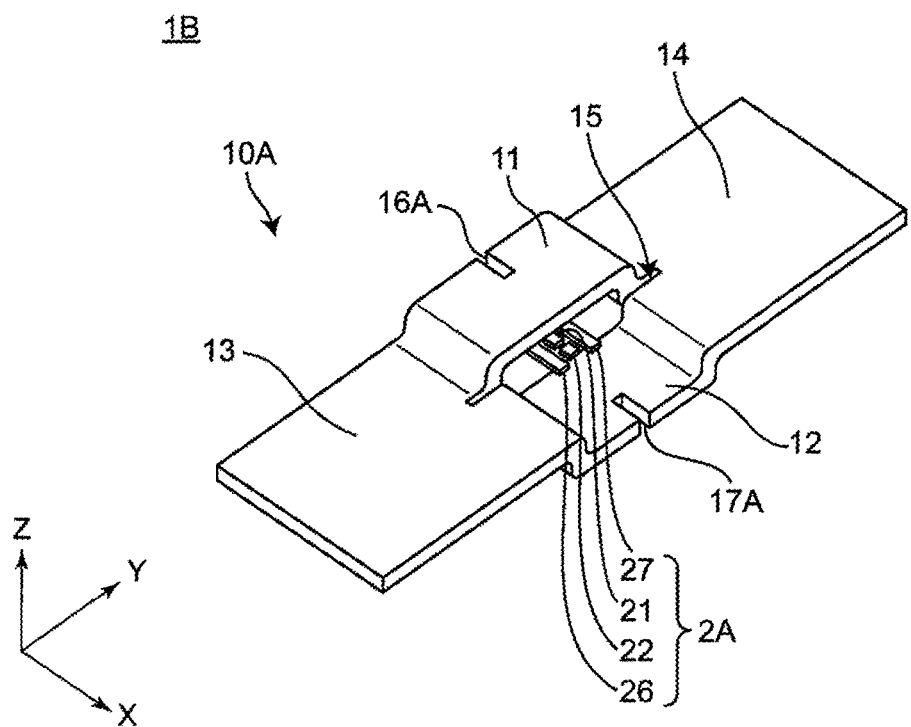
FIG. 18 is a perspective view of a current sensor according to a third preferred embodiment of the present invention.

A structure of a current sensor according to the third preferred embodiment is described below with reference to FIG. 18. FIG. 18 is a perspective view of a current sensor 1B according to the third preferred embodiment.

As shown in FIG. 18, the current sensor 1B according to the third preferred embodiment includes two magnets 26 and 27 in a magnetic detector 2A in addition to the same or similar features as the current sensor 1A according to the second preferred embodiment (FIG. 11). As the magnets 26 and 27, for example, bulk magnets of ferrite, SmCo, and so forth, thin film magnets, and so forth may preferably be used.

The first magnet 26 and the second magnet 27 are arranged to be opposed to each other in the longitudinal direction (Y direction) of the busbar 10A with the magnetic sensors 21 and 22 interposed therebetween. Each of the magnets 26 and 27 preferably has a wider width than the width of the chip in the X direction, for example (see FIG. 19).

Figure 19:
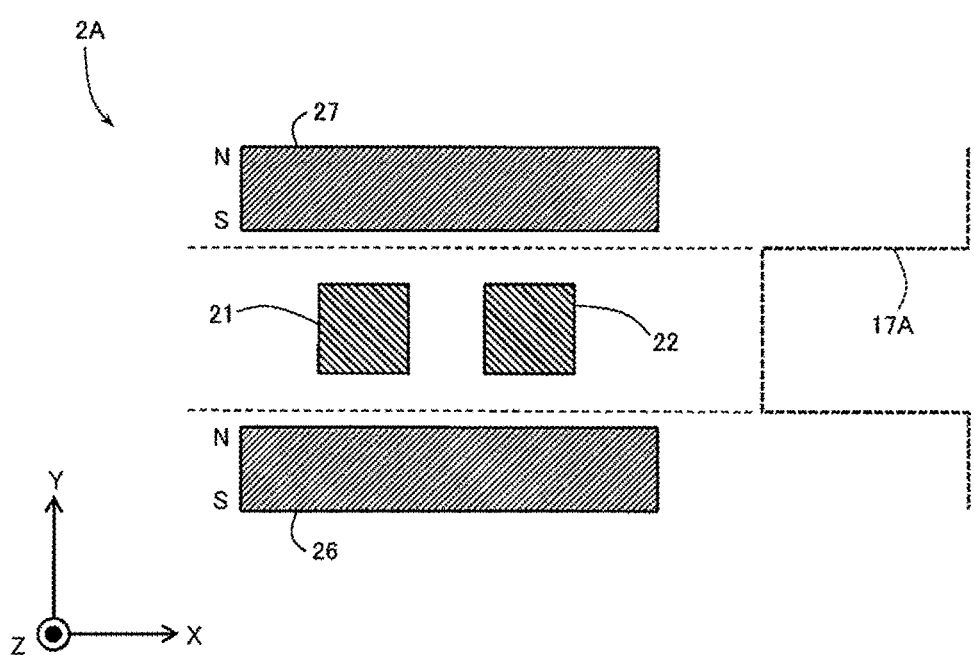
FIG. 19 is a diagram of a magnetic detector of the current sensor according to the third preferred embodiment of the present invention.

The magnetic detector 2A in the third preferred embodiment is described below with respect to FIG. 19. FIG. 19 is a diagram of the magnetic detector 2A of the current sensor 1B according to the third preferred embodiment.

FIG. 19 shows the magnetic detector 2A in plan view from the Z direction of FIG. 18. In the third preferred embodiment, the Y position of the first magnet 26 is offset on the −Y side from the range in which the notch portions 16A and 17A are provided. Further, the Y position of the second magnet 27 is offset on the +Y side from the range in which the notch portions 16A and 17A are provided.

In the magnetic detector 2A, the magnets 26 and 27 respectively bias the first and second magnetic sensors 21 and 22. As shown in FIG. 19, the N poles and S poles of the magnets 26 and 27 are preferably aligned in the Y direction.

Accordingly, the magnetic fields by the magnets 26 and 27 are produced in the vicinities of the magnetic sensors 21 and in the direction (Y direction) that intersect with the directions of the sensitivity axes of the first and second magnetic sensors 21 and 22 (X direction). The magnetic fields produced in the vicinities of the magnetic sensors 21 and 22 are set separately from the signal magnetic fields by the magnets 26 and 27, and the dynamic ranges of the magnetic sensors 21 and 22 are thus adjusted.

Further, the widths of the magnets 26 and 27 are wider than the interval between the first and second magnetic sensors 21 and 22 (or the width of the chip), and the magnetic fields that bias the magnetic sensors 21 and 22 may thus be uniformly or substantially uniformly provided.

In a case where the above-described adjustment is performed, a circumstance is assumed in which the magnets degrade due to exposure to an external magnetic field or the like and the measurement precision of the current sensor is thus reduced. Thus, in the current sensor 1B according to the third preferred embodiment, the magnets 26 and 27 are arranged on the outside of the ranges of the notch portions 16A and 17A, that is, in a region that is covered by the busbar 10A, and the magnets 26 and 27 are thus less likely to be exposed to an external magnetic field or the like. Accordingly, degradation of the magnets 26 and 27 is reduced or prevented, and the measurement precision of the current sensor 1B is thus maintained high.

Note that in the above description, an example is described where the entire magnets 26 and 27 are arranged on the outside of the ranges of the notch portions 16A and 17A. However, arrangement is not limited to this, and portions of the magnets 26 and 27 may be arranged on the outside of the ranges of the notch portions 16A and 17A. Accordingly, degradation of the magnets 26 and 27 may also be reduced or prevented.

As described above, the current sensor 1B according to the third preferred embodiment further includes the magnets 26 and 27. At least portions of the magnets 26 and 27 are arranged on the outside of the range in which the first notch portion 16A is provided in the longitudinal direction of the first flow path 11. Accordingly, the magnets 26 and 27 are less likely to be exposed to an external magnetic field or the like, and degradation of the magnets 26 and 27 is thus reduced or prevented.

In the above description, an example is described where the two magnets 26 and 27 are included. However, the magnets included to bias or the like in the current sensor 1B are not limited to two magnets, and may be three or more magnets or one magnet. Further, in cases where degradation of the magnets does not particularly have to be taken into consideration, the magnets are not limited to the above-described arrangement, and the magnets may be included in various arrangements.

Fourth Preferred Embodiment

In the first to third preferred embodiments, the busbars that have the level difference between the first and second flow paths are included. In the fourth preferred embodiment, a description is provided of a current sensor in which a busbar is planar.

Figure 20:
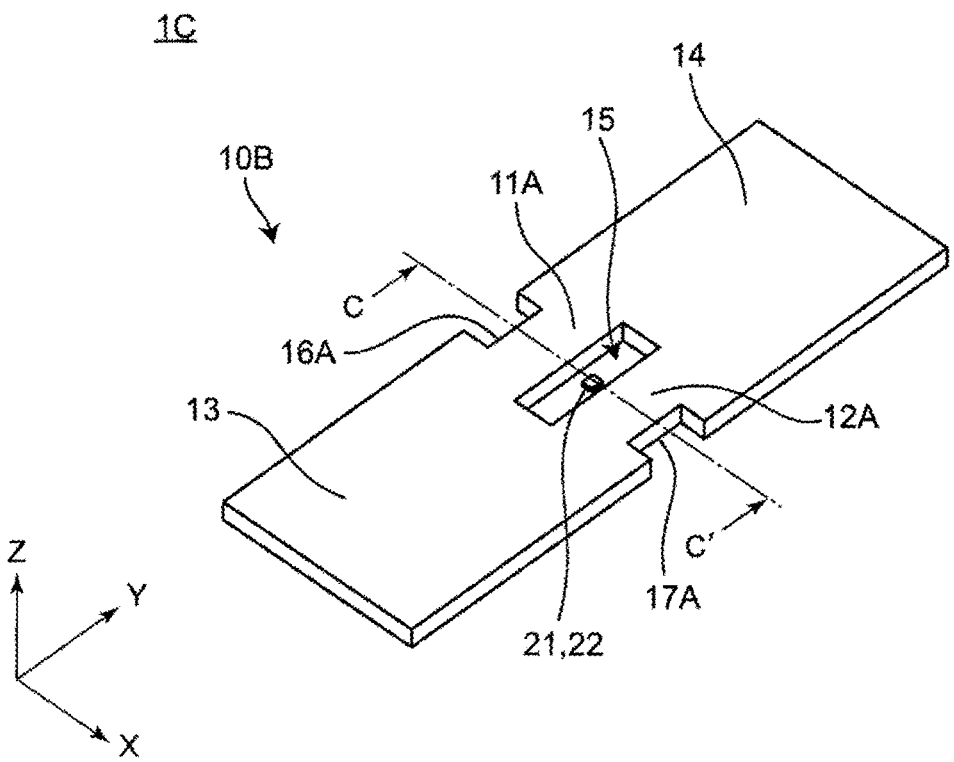
FIG. 20 is a perspective view of a current sensor according to a fourth preferred embodiment of the present invention.

A structure of a current sensor according to the fourth preferred embodiment is described below with reference to FIG. 20. FIG. 20 is a perspective view of a current sensor 1C according to the fourth preferred embodiment.

Similar to the second preferred embodiment (FIG. 11), the current sensor 1C according to the fourth preferred embodiment includes a busbar 10B that is planar or substantially planar as shown in FIG. 20 instead of the busbar 10A that includes the level difference. Accordingly, the current sensor 1C has a low profile, and the size of the current sensor 1C is thus reduced.

In the busbar 10B in the fourth preferred embodiment, a first flow path 11A and a second flow path 12A are arranged on the same plane (XY plane) with the first and second joining portions 13 and 14.

In the fourth preferred embodiment, the first and second magnetic sensors 21 and 22 are arranged with the sensitivity axes directed in the +Z direction (or −Z direction), for example. As the first and second magnetic sensors 21 and 22 in the fourth preferred embodiment, for example, hall elements may preferably be included, or various types of magneto resistance elements may be included by adjusting the arrangement or the like.

The magnetic sensors 21 and 22 are arranged in an inner portion of the slit 15 of a busbar 10B, for example. In this case, the current sensor 1C may be relatively thin.

Figure 21:
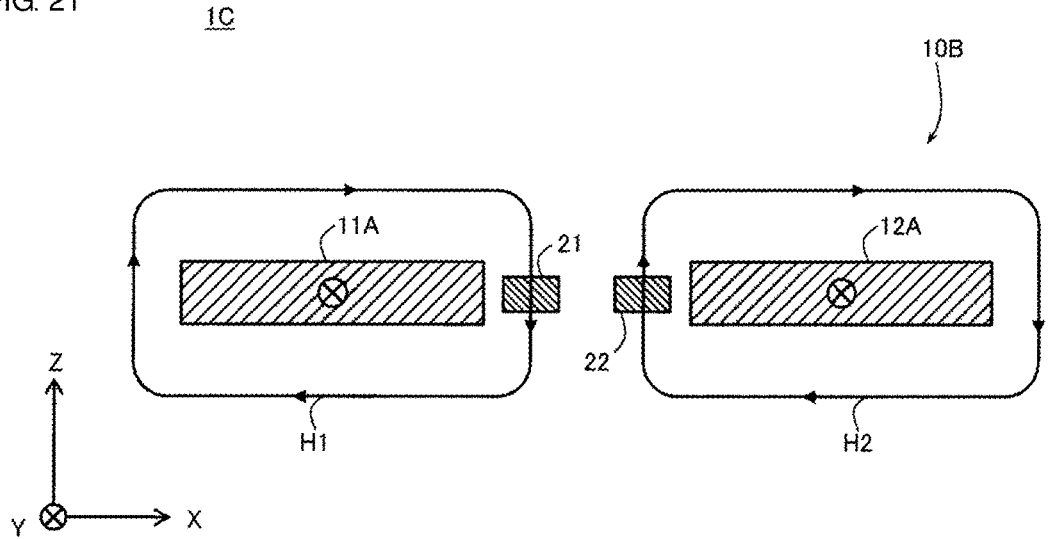
FIG. 21 is a diagram of the signal magnetic fields in the current sensor according to the fourth preferred embodiment of the present invention.
Figure 22:
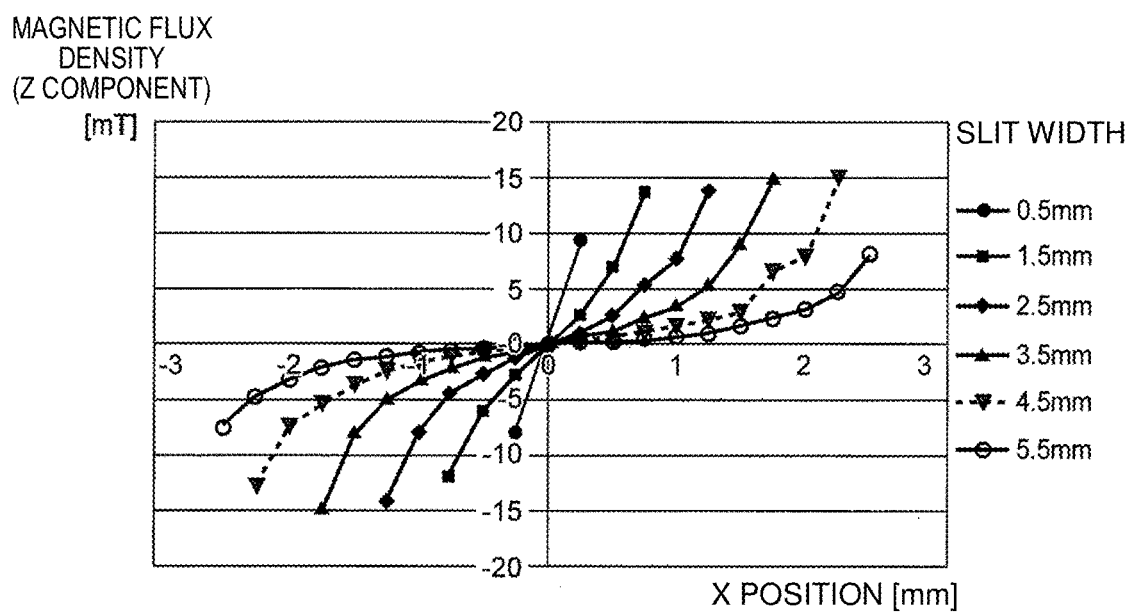
FIG. 22 is a graph that shows simulation results about the current sensor according to the fourth preferred embodiment of the present invention.

A description of an operation of the current sensor 1C with reference to FIGS. 21 and 22 is provided below.

FIG. 21 is a diagram of signal magnetic fields in the current sensor 1C according to the fourth preferred embodiment. FIG. 21 corresponds to C-C' section of FIG. 20. C-C' section is a section that passes through the notch portions 16A and 17A and the magnetic sensors 21 and 22 in the current sensor 1C and is parallel with the XY plane.

In the current sensor 1C in the fourth preferred embodiment, the first and second flow paths 11A and 12A are arranged on the same plane. Consequently, as shown in FIG. 21, in a region between the first and second flow paths 11A and 12A, the Z component of the signal magnetic field H1 in the vicinity of the first flow path 11A and the Z component of the signal magnetic field H2 in the vicinity of the second flow path 12A are in the opposite directions to each other. Therefore, similarly to the first to third preferred embodiments, the signal magnetic fields H1 and H2 in the reverse phases to each other are input to the first and second magnetic sensors 21 and 22 arranged in the above region.

FIG. 22 is a graph that shows simulation results about the current sensor 1C according to the fourth preferred embodiment. In FIG. 22, a similar magnetic field analysis to the simulations in the first and second preferred embodiments (FIG. 9) was performed by a simulation model that corresponded to C-C' section of FIG. 20 (see FIG. 21).

In FIG. 22, the slit width in the current sensor 1C according to the fourth preferred embodiment is narrowed, and the slope of the Z component intensity of the magnetic flux density thus becomes steeper. Thus, also in the current sensor 1C according to the fourth preferred embodiment, the slit width is narrowed, the signal to noise ratio is thus increased, and the current measurement precision is significantly increased.

As described above, in the current sensor 1C according to the fourth preferred embodiment, the first flow path 11A, the second flow path 12A, and the first joining portion 13 are provided on the same plane. Accordingly, the current sensor 1C may have a small size.

In the fourth preferred embodiment, the first magnetic sensor 21 and the second magnetic sensor 22 are arranged in a region between the first and second flow paths 11A and 12A on the same plane, that is, the inner portion of the slit 15. Accordingly, the current sensor 1C may be thin.

Note that the arrangement positions of the magnetic sensors 21 and 22 are not limited to the same plane as the portions 11A, 12A, 13, and 14 of the busbar 10B. For example, the magnetic sensors 21 and 22 may be arranged in a range, in which the Z components of the signal magnetic fields H1 and H2 are detectable in the reverse phases to each other, in an outer portion of the slit 15.

Fifth Preferred Embodiment

In the first to fourth preferred embodiments, the busbars include two joining portions. In the fifth preferred embodiment, a description is provided below of a current sensor in which a busbar includes one joining portion.

Figure 23:
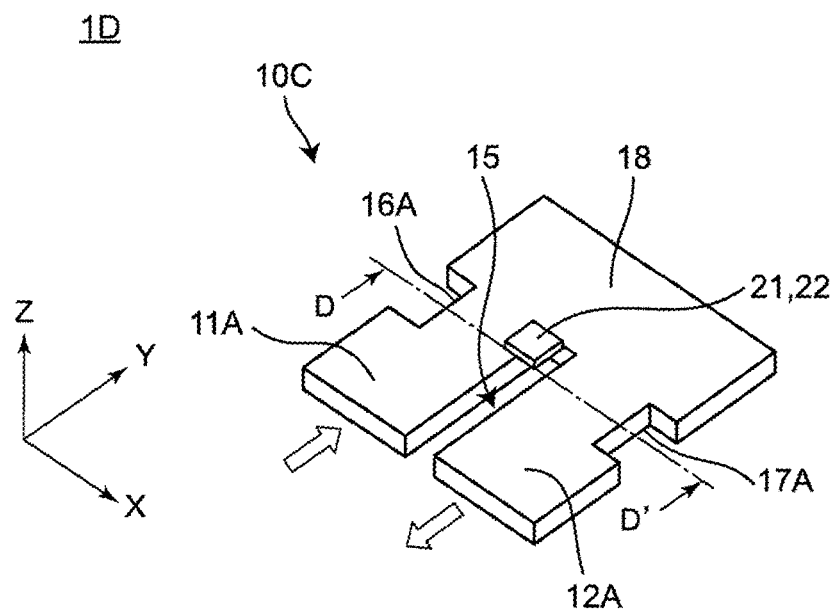
FIG. 23 is a perspective view of a current sensor according to a fifth preferred embodiment of the present invention.

A structure of a current sensor according to the fifth preferred embodiment is described below with reference to FIG. 23. FIG. 23 is a perspective view of a current sensor 1D according to the fifth preferred embodiment.

Similar to the fourth preferred embodiment (FIG. 20), the current sensor 1D according to the fifth preferred embodiment includes a busbar 10C that includes one joining portion 18 as shown in FIG. 23 instead of the busbar 10B that includes the two joining portions 13 and 14. In other words, the busbar 10C is isolated between the first flow path 11A and the second flow path 12A on the opposite side (−Y side) to the joining portion 18 in which the first and second flow paths 11A and 12A merge with each other in the longitudinal direction (Y direction).

FIG. 23 shows an example of the direction of current in a case where current is caused to flow through the busbar 10C in the fifth preferred embodiment. In this example, the current flows in the +Y direction in the first flow path 11A, flows through the joining portion 18 as a bypass, and flows in the −Y direction in the second flow path 12A. That is, in the busbar 10C in the fifth preferred embodiment, the flow of current turns in the joining portion 18, and the joining portion 18 joins an exit of the first flow path 11A and an entrance of the second flow path 12A.

Further, in FIG. 23, the first and second magnetic sensors 21 and 22 are arranged farther on the +Z side than the first and second flow paths 11A and 12A in the vicinity of the slit 15. The first and second magnetic sensors 21 and 22 may be arranged farther on the −Z side than the flow paths 11A and 12A. The magnetic sensors 21 and 22 are arranged with the sensitivity axes directed in the +X direction (or −X direction), for example.

A description is provided below of an operation of the current sensor 1D described above with respect to FIGS. 24 and 25.

Figure 24:
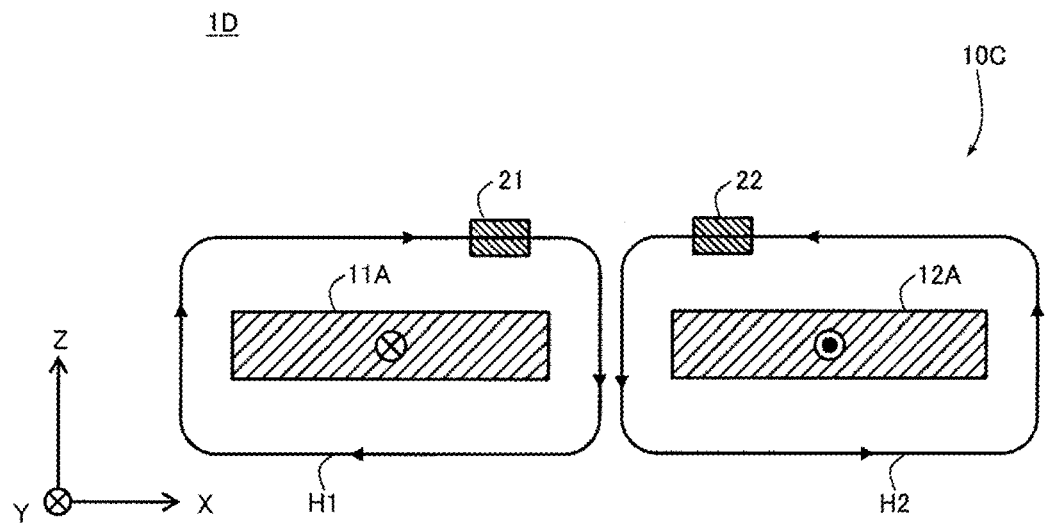
FIG. 24 is a diagram of the signal magnetic fields in the current sensor according to the fifth preferred embodiment of the present invention.

FIG. 24 is a diagram of signal magnetic fields in the current sensor 1D according to the fifth preferred embodiment. FIG. 24 corresponds to D-D' section of FIG. 23. D-D' section is a section that passes through the notch portions 16A and 17A and the magnetic sensors 21 and 22 in the current sensor 1D and is parallel or substantially parallel with the XY plane.

In the current sensor 1D according to the fifth preferred embodiment, because the current flows in the opposite directions in the first flow path 11A and the second flow path 12A, the signal magnetic field H1 in the vicinity of the first flow path 11A and the signal magnetic field H2 in the vicinity of the second flow path 12A circulate in the opposite directions to each other, as shown in FIG. 24. Thus, in a region on the +Z side (or −Z side) between the first and second flow paths 11A and 12A, as shown in FIG. 24, the X component of the signal magnetic field H1 in the vicinity of the first flow path 11A and the X component of the signal magnetic field H2 in the vicinity of the second flow path 12A are in the opposite directions to each other. Therefore, the signal magnetic fields H1 and H2 in the reverse phases to each other are input to the first and second magnetic sensors 21 and 22 arranged in the above region.

Figure 25:
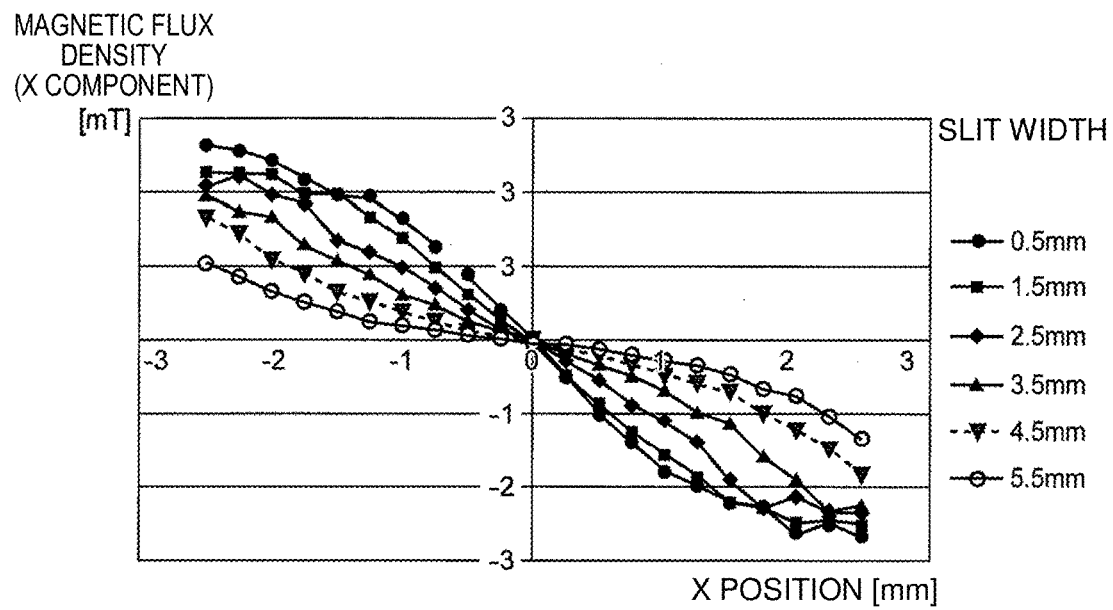
FIG. 25 is a graph that shows simulation results about the current sensor according to the fifth preferred embodiment of the present invention.

FIG. 25 is a graph that shows simulation results of the current sensor 1D according to the fifth preferred embodiment. In FIG. 25, a similar magnetic field analysis to the simulation in the fourth preferred embodiment was performed by a simulation model that corresponded to D-D' section of FIG. 23 (see FIG. 24).

FIG. 25 shows the distribution of the X components of the magnetic flux density in various kinds of X positions that are separated, by about 2 mm on the +Z side, from a main surface of the busbar 10C. In FIG. 25, also in the current sensor 1D according to the fifth preferred embodiment, the distribution of the X components of the magnetic flux density is provided in the reverse phases between the X position >0 and the X position <0 with the X position=0 (the central position of the slit 15) being a boundary. Further, the slit width is narrowed, and the slope of the X component intensity of the magnetic flux density thus becomes steeper. Thus, also in the current sensor 1D according to the fifth preferred embodiment, the slit width is narrowed, the signal to noise ratio is thus increased, and the current measurement precision is significantly increased.

As described above, in the current sensor 1D according to the fifth preferred embodiment, the joining portion 18 joins the entrance of the first flow path 11 and the exit of the second flow path 12 to each other. Accordingly, in the current sensor 1D in which the current flows while turning between the first and second flow paths 11A and 12A, the slit width is also narrowed, the signal to noise ratio is thus increased, and the current measurement precision is significantly increased. Further, the range in which the notch portions 16A and 17A are provided is restricted to the vicinities of the magnetic sensors 21 and 22, and heat generation when current is applied is thus reduced.

Other Preferred Embodiments

In the above description, housings and the like for the current sensors 1 and 1A to 1D according to the preferred embodiments are not shown. However, various kinds of mounting are applicable to the current sensors 1 and 1A to 1D. As examples, mounting examples of the current sensor 1B according to the third preferred embodiment are described below with respect to FIGS. 26 and 27.

Figure 26:
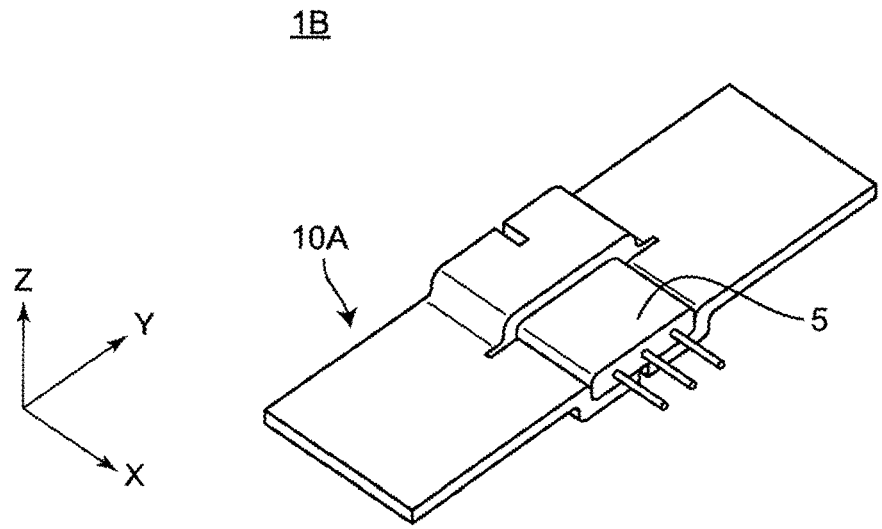
FIG. 26 is a perspective view that shows a first mounting example of the current sensor.

FIG. 26 is a perspective view that shows a first mounting example of the current sensor 1B. In this example, the magnetic detector 2A (FIG. 18) of the current sensor 1B is packaged in a housing 5. The housing 5 includes a material with electrical insulation, for example, an engineering plastic such as polyphenylene sulfide (PPS). Heat generation control of the busbar 10A may be performed in the housing 5 by a synthetic resin with high temperature resistance, such as PPS.

The housing 5 and the busbar 10A are fixed to each other by screw fastening, thermal welding, or the like, for example. Various kinds of components that define the magnetic detector 2A are enclosed in a package and fixed to the busbar 10A, and size reduction and cost reduction of the current sensor 1B is thus preferable.

Figure 27:
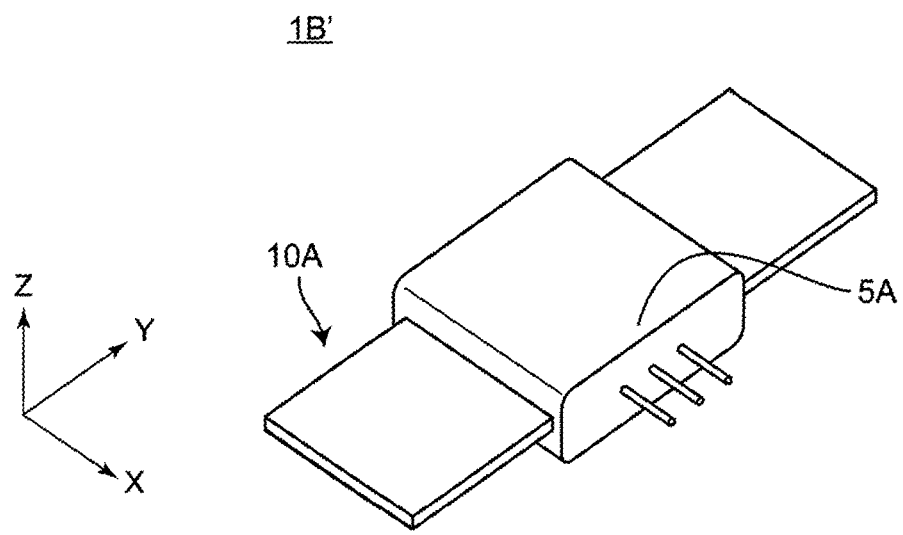
FIG. 27 is a perspective view that shows a second mounting example of the current sensor.

FIG. 27 is a perspective view that shows a current sensor 1B' of a second mounting example. In the current sensor 1B' of this example, the magnetic detector 2A is, with the first and second flow paths 11 and 12 (FIG. 18) of the busbar 10A, inserted in the housing 5 such as a resin mold by insert-molding, for example. The portions of the current sensor 1B' are integrally fixed by insert-molding, and the resistance of the current sensor 1B' against mechanical loads, such as vibration and impacts of the busbar 10A, is able to be provided.

A magnetic shield that blocks disturbance magnetic fields and the like may further be provided in the current sensors 1 and 1A to 1D according to the above preferred embodiments. The magnetic shield may be made of various magnetic materials and may particularly include soft magnetic materials such as a PB permalloy, a PC permalloy, 42 Ni, an oriented electromagnetic steel sheet, a non-oriented electromagnetic steel sheet, and iron, for example. Further, magnetic shields of different materials, which are stacked, may be provided.

In the magnetic shield, materials with high magnetic permeability such as a PB permalloy, a PC permalloy, and 42 Ni, for example, are included, and the shielding effect by the magnetic shield is thus improved. Further, in a case where it is assumed that the magnetic field in the magnetic shield is large, a non-oriented electromagnetic steel sheet, iron, and the like may be provided, and the upper limit value of the magnetic field to saturation of the magnetic shield may be enlarged. Because the magnetic permeability of the magnetic shield reduces when the magnetic field in a magnetic body becomes larger, lowering the magnetic field in the magnetic body is important to reduce or prevent the shield effect from lowering.

The dimensions such as the thickness and length of the magnetic shield may be appropriately selected in accordance with the kind of the magnetic sensor and the usage environment. The distance of a cavity of the magnetic shield may appropriately be designed in accordance with the input magnetic field or the like of the magnetic sensor. A fixing method of the magnetic shield is not particularly limited but may be fixing to the housing by an adhesive or may be fixing by thermal welding of a resin, insert-molding into the housing, screw fastening, or the like.

Further, the current sensors 1 and 1A to 1D according to the above preferred embodiments may be used to measure plural-phase current, such as three-phase alternating current, for example. In this case, for example, the current sensors that correspond to the plural phases are arranged in parallel or substantially in parallel, the current of each of the phases is thus measured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
a conductor through which a current as a measurement target flows and which includes a first flow path, a second flow path adjacent to or in a vicinity of the first flow path in a width direction of the first flow path, and a first joining portion in which the first flow path and the second flow path merge with each other; and
two magnetic sensors that detect magnetic fields produced by the current which flows through the conductor and are provided side by side in the width direction; wherein
the conductor includes a first notch portion, in which a side edge in a farther side portion from the second flow path, of both of side edges of the first flow path in the width direction is notched; and
a first magnetic sensor of the two magnetic sensors, which is located in a position closer to the first flow path than to the second flow path, is positioned in a vicinity of the side edge on an opposite side to the first notch portion in the first flow path.

2. The current sensor according to claim 1, wherein a width of the first notch portion in the width direction of the first flow path is wider than an interval between the first and second flow paths in the width direction.

3. The current sensor according to claim 1, wherein
the first notch portion is provided in a portion of a range in a longitudinal direction of the first flow path; and
at least a portion of the first magnetic sensor is positioned in a range in which the first notch portion is provided in the longitudinal direction of the first flow path.

4. The current sensor according to claim 3, further comprising:
a magnet; wherein
at least a portion of the magnet is disposed outside of the range in which the first notch portion is provided in the longitudinal direction of the first flow path.

5. The current sensor according to claim 3, wherein the first notch portion is positioned at a center or approximate center in the longitudinal direction of the first flow path.

6. The current sensor according to claim 3, wherein a position of the first magnetic sensor in the longitudinal direction of the first flow path is a center or approximate center of the first notch portion.

7. The current sensor according to claim 3, wherein a width of the first notch portion in the width direction of the first flow path is equal to or wider than a length of the first notch portion in the longitudinal direction of the first flow path.

8. The current sensor according to claim 3, wherein, in the width direction, a width of the first flow path in a lateral side portion of the first notch portion is wider than a width of the first notch portion.

9. The current sensor according to claim 2, wherein
the conductor includes a slit that extends along a longitudinal direction of the conductor between the first flow path and the second flow path; and
in the width direction, a width of the slit is narrower than the width of the first notch portion.

10. The current sensor according to claim 1, wherein
the conductor includes a second notch portion, in which a side edge in a farther side portion from the first flow path, of both of side edges of the second flow path in the width direction is notched; and
a second magnetic sensor of the two magnetic sensors, which is located in a position closer to the second flow path than to the first flow path, is positioned in a vicinity of the side edge on an opposite side to the second notch portion in the second flow path.

11. The current sensor according to claim 10, wherein the second notch portion is provided in a portion of a range in a longitudinal direction of the second flow path.

12. The current sensor according to claim 10, wherein the first notch portion and the second notch portion are disposed side by side in the width direction.

13. The current sensor according to claim 10, wherein
a slit is provided which extends along the longitudinal direction of the conductor between the first flow path and the second flow path; and
in the width direction, a width of the slit is narrower than respective widths of the first and second notch portions.

14. The current sensor according to claim 10, wherein
the first magnetic sensor is located in a lateral side portion of the first notch portion in the first flow path and on one of both sides of the first flow path in a height direction that intersects a longitudinal direction of the conductor and the width direction; and
the second magnetic sensor is located in a lateral side portion of the second notch portion in the second flow path and on one of both sides of the second flow path in the height direction.

15. The current sensor according to claim 1, wherein in sections that have a common orientation along the width direction, a maximum cross-sectional area of the first joining portion is larger than a sum of a maximum cross-sectional area of the first flow path and a maximum cross-sectional area of the second flow path.

16. The current sensor according to claim 1, wherein
the first joining portion joins an entrance of the first flow path and an entrance of the second flow path to each other; and
the conductor includes a second joining portion that joins an exit of the first flow path and an exit of the second flow path to each other.

17. The current sensor according to claim 16, wherein the first flow path and the second flow path are located in mutually different positions in a height direction, which intersects a longitudinal direction of the conductor and the width direction, between the first and second joining portions.

18. The current sensor according to claim 17, wherein
the two magnetic sensors include MR elements that are provided on a substrate shared by the MR elements; and
the substrate is located between the first flow path and the second flow path in the height direction.

19. The current sensor according to claim 1, wherein the first joining portion joins an entrance of the first flow path and an exit of the second flow path to each other.

20. The current sensor according to claim 1, wherein the first flow path, the second flow path, and the first joining portion are provided on a same plane.

21. The current sensor according to claim 20, wherein the two magnetic sensors are located in a region between the first and second flow paths on the same plane.

22. The current sensor according to claim 1, wherein
the two magnetic sensors generate, as respective detection results, outputs whose changes of increase and decrease with respect to magnetic fields in a same or substantially a same direction have a same or substantially a same tendency as each other, and
the current sensor further includes an amplifier circuit that differentially amplifies the detection results of each of the magnetic sensors.

* * * * *